(12) United States Patent  (10) Patent No.: US 7,764,143 B2
Miyata et al.  (45) Date of Patent: Jul. 27, 2010

(54) ELECTRONIC COMPONENT INCLUDING A MAGNETIC LAYER AND A DIELECTRIC LAYER

(75) Inventors: Yuichi Miyata, Saku (JP); Yukio Isowaki, Saku (JP); Hiroyuki Maruta, Saku (JP)

(73) Assignee: Soshin Electric Co., Ltd., Saku (JP)

( * ) Notice: Subject to any disclaimer, the term of this patent is extended or adjusted under 35 U.S.C. 154(b) by 352 days.

(21) Appl. No.: 11/814,111

(22) PCT Filed: Feb. 10, 2006

(86) PCT No.: PCT/JP2006/302387

§ 371 (c)(1),
(2), (4) Date: Jul. 17, 2007

(87) PCT Pub. No.: WO2006/085624

PCT Pub. Date: Aug. 17, 2006

(65) Prior Publication Data

US 2009/0009267 A1    Jan. 8, 2009

(30) Foreign Application Priority Data

Feb. 10, 2005  (JP) .............................. 2005-034588

(51) Int. Cl.
   *H03H 7/00*  (2006.01)
(52) U.S. Cl. ...................................... 333/185; 333/175
(58) Field of Classification Search ................ 333/175, 333/185, 202, 204
   See application file for complete search history.

(56) References Cited

U.S. PATENT DOCUMENTS

| | | | |
|---|---|---|---|
| 3,582,835 A * | 6/1971 | Welding ..................... | 333/174 |
| 4,888,568 A | 12/1989 | Kawaguchi | |
| 5,332,984 A * | 7/1994 | Abe et al. .................... | 333/219 |
| 6,423,243 B2 | 7/2002 | Inoue | |
| 6,954,116 B2 * | 10/2005 | Nosaka ........................ | 333/26 |
| 7,160,828 B2 * | 1/2007 | Park et al. ................... | 501/139 |

FOREIGN PATENT DOCUMENTS

| | | |
|---|---|---|
| CN | 1322364 A1 | 11/2001 |
| EP | 0843410 A2 * | 5/1998 |
| JP | 63-222064 A1 | 9/1988 |
| JP | 63-285150 A1 | 11/1988 |
| JP | 04-274108 A1 | 9/1992 |
| JP | 06-215985 A1 | 8/1994 |

(Continued)

OTHER PUBLICATIONS

U.S. Appl. No. 11/814,113, filed Jul. 17, 2007, Yuichi Miyata, et al.

*Primary Examiner*—Robert Pascal
*Assistant Examiner*—Kimberly E Glenn
(74) *Attorney, Agent, or Firm*—Burr & Brown

(57) ABSTRACT

The magnetic material constituting a magnetic portion is a ferrite mainly containing 31-42 mol % of NiO, 2-10 mol % of ZnO, 43-48 mol % of $Fe_2O_3$, 0.5-3 mol % of $Co_3O_4$, and 10-14 mol % of CuO. The dielectric material constituting a dielectric portion is mainly composed of $xBaO \cdot y_1Nd_2O_3 \cdot y_2Bi_2O_3 \cdot zTiO_2$ wherein $0.09 \leq x \leq 0.25$, $0.05 \leq y_1 \leq 0.20$, $0 < y_2 \leq 0.10$ and $0.60 \leq z \leq 0.75$. The dielectric material constituting a joint portion is a $BaO-TiO_2-ZnO$ dielectric material.

4 Claims, 24 Drawing Sheets

FOREIGN PATENT DOCUMENTS

| | | | |
|---|---|---|---|
| JP | 2505135 B2 | 4/1996 |
| JP | 09-298438 A1 | 11/1997 |
| JP | 11-136066 A1 | 5/1999 |
| JP | 2000-295057 A1 | 10/2000 |
| JP | 2001-136042 A1 | 5/2001 |
| JP | 2003-037022 A1 | 2/2003 |
| JP | 2003-168945 A1 | 6/2003 |
| JP | 2004-207902 A1 | 7/2004 |

* cited by examiner

FIG. 10

| | COMPOSITION | | | | DIELECTRIC CHARACTERISTIC | | | EVALUATION | | |
|---|---|---|---|---|---|---|---|---|---|---|
| | x | y1 | y2 | z | ε | tan δ | τf | MINIATURIZATION | CONDUCTOR PRINTING | TEMPERATURE CHARACTERISTIC |
| EXAMPLE 1 | 0.100 | 0.120 | 0.050 | 0.730 | 68 | 0.0005 | −12 | ○ | ○ | ○ |
| EXAMPLE 2 | 0.160 | 0.139 | 0.031 | 0.670 | 95 | 0.0009 | −17 | ○ | ○ | ○ |
| EXAMPLE 3 | 0.180 | 0.108 | 0.012 | 0.700 | 66 | 0.0002 | −38 | ○ | ○ | ○ |
| EXAMPLE 4 | 0.145 | 0.176 | 0.020 | 0.660 | 72 | 0.0007 | −23 | ○ | ○ | ○ |
| EXAMPLE 5 | 0.155 | 0.140 | 0.035 | 0.670 | 82 | 0.0010 | −15 | ○ | ○ | ○ |
| COMPARATIVE EXAMPLE 1 | 0.070 | 0.110 | 0.020 | 0.800 | 54 | 0.0009 | −71 | × | ○ | ○ |
| EXAMPLE 6 | 0.100 | 0.070 | 0.080 | 0.750 | 103 | 0.0011 | −83 | ○ | ○ | ○ |
| EXAMPLE 7 | 0.200 | 0.060 | 0.080 | 0.660 | 114 | 0.0019 | −91 | ○ | ○ | ○ |
| EXAMPLE 8 | 0.250 | 0.051 | 0.079 | 0.620 | 120 | 0.0018 | −96 | ○ | ○ | ○ |
| EXAMPLE 9 | 0.160 | 0.071 | 0.074 | 0.695 | 88 | 0.0014 | −69 | ○ | ○ | ○ |
| COMPARATIVE EXAMPLE 2 | 0.200 | 0.210 | 0.100 | 0.490 | 132 | 0.0025 | −114 | ○ | × | × |
| EXAMPLE 10 | 0.090 | 0.200 | 0.100 | 0.610 | 108 | 0.0012 | −82 | ○ | ○ | ○ |
| COMPARATIVE EXAMPLE 3 | 0.160 | 0.190 | 0.080 | 0.570 | 122 | 0.0018 | −115 | ○ | × | × |
| EXAMPLE 4 | 0.150 | 0.040 | 0.090 | 0.720 | 119 | 0.0020 | −102 | ○ | ○ | × |
| EXAMPLE 11 | 0.250 | 0.051 | 0.079 | 0.620 | 118 | 0.0019 | −91 | ○ | ○ | ○ |
| COMPARATIVE EXAMPLE 5 | 0.300 | 0.024 | 0.076 | 0.600 | 120 | 0.0021 | −106 | ○ | ○ | × |
| COMPARATIVE EXAMPLE 6 | 0.180 | 0.010 | 0.110 | 0.700 | 116 | 0.0022 | −105 | ○ | ○ | × |
| EXAMPLE 12 | 0.170 | 0.070 | 0.076 | 0.684 | 113 | 0.0017 | −91 | ○ | ○ | ○ |
| EXAMPLE 13 | 0.176 | 0.090 | 0.074 | 0.660 | 116 | 0.0014 | −93 | ○ | ○ | ○ |

FIG. 11

|  | BaO | ZnO | TiO$_2$ |
|---|---|---|---|
| EXAMPLE 14 | 10 | 30 | 60 |
| EXAMPLE 15 | 20 | 30 | 50 |
| EXAMPLE 16 | 20 | 15 | 65 |
| EXAMPLE 17 | 30 | 40 | 30 |
| EXAMPLE 18 | 40 | 40 | 20 |

FIG. 12

| | NiO | ZnO | Fe2O3 | Co3O4 | CuO | INITIAL MAGNETIC PERMEABILITY | FREQUENCY FOR Q = 100 |
|---|---|---|---|---|---|---|---|
| EXAMPLE 19 | 31 | 10 | 45 | 2 | 12 | 25 | 105 |
| EXAMPLE 20 | 34 | 7 | 45 | 2 | 12 | 20 | 120 |
| EXAMPLE 21 | 39.5 | 2 | 46 | 0.5 | 12 | 14 | 160 |
| EXAMPLE 22 | 38.5 | 2 | 46 | 1.5 | 12 | 11 | 250 |
| EXAMPLE 23 | 37 | 4 | 46 | 1 | 12 | 18 | 150 |
| EXAMPLE 24 | 36.5 | 4 | 46 | 1.5 | 12 | 17 | 170 |
| EXAMPLE 25 | 33 | 7 | 46 | 2 | 12 | 23 | 110 |
| EXAMPLE 26 | 41 | 2 | 43 | 3 | 11 | 11 | 190 |
| EXAMPLE 27 | 31 | 6 | 48 | 3 | 12 | 13 | 110 |
| COMPARATIVE EXAMPLE 7 | 32 | 4 | 50 | 2 | 12 | 9 | 90 |
| COMPARATIVE EXAMPLE 8 | 34 | 0.5 | 52 | 1.5 | 12 | 8 | 260 |
| COMPARATIVE EXAMPLE 9 | 44 | 2 | 42 | 1 | 11 | 7 | 280 |
| COMPARATIVE EXAMPLE 10 | 29 | 8 | 48 | 3 | 12 | 26 | 90 |
| COMPARATIVE EXAMPLE 11 | 31 | 12 | 45 | 1 | 11 | 30 | 75 |
| COMPARATIVE EXAMPLE 12 | 37 | 5 | 46 | 0 | 12 | 17 | 95 |
| COMPARATIVE EXAMPLE 13 | 34 | 4 | 46 | 4 | 12 | 8 | 120 |
| COMPARATIVE EXAMPLE 14 | 40 | 1 | 47 | 0 | 12 | 16 | 70 |
| COMPARATIVE EXAMPLE 15 | 40.7 | 1 | 46 | 0.3 | 12 | 16 | 100 |
| COMPARATIVE EXAMPLE 16 | 39.5 | 1 | 46 | 1.5 | 12 | 10 | 250 |

FIG. 24

| | COMPOSITION | | | | | INITIAL MAGNETIC PERMEABILITY 10MHz, 25°C | TEMPERATURE COEFFICIENT τμ 10MHz | FREQUENCY FOR Q = 100 (MHz) |
|---|---|---|---|---|---|---|---|---|
| | Fe2O3 | NiO | CuO | ZnO | Co3O4 | | | |
| COMPARATIVE EXAMPLE 101 | 47 | 40 | 12 | 1 | 0 | 16 | 860 | 70 |
| COMPARATIVE EXAMPLE 102 | 46 | 40.7 | 12 | 1 | 0.3 | 17 | 1060 | 100 |
| COMPARATIVE EXAMPLE 103 | 46 | 39.5 | 12 | 1 | 1.5 | 10 | 4050 | 250 |
| COMPARATIVE EXAMPLE 104 | 46 | 36.5 | 12 | 4 | 1.5 | 14 | 2350 | 170 |
| EXAMPLE 101 | 46.9 | 40.45 | 12 | 0.5 | 0.15 | 14 | 160 | 126 |
| COMPARATIVE EXAMPLE 105 | 46 | 33.5 | 12 | 7 | 1.5 | 22 | 4000 | 101 |
| COMPARATIVE EXAMPLE 106 | 47 | 37 | 12 | 4 | 0 | 25 | 360 | 65 |
| COMPARATIVE EXAMPLE 107 | 46 | 34.3 | 12 | 7 | 0.7 | 30 | 1200 | 90 |
| EXAMPLE 102 | 47.3 | 38.6 | 12 | 1.8 | 0.3 | 16 | 50 | 118 |
| EXAMPLE 103 | 47.5 | 39.7 | 12 | 0.5 | 0.3 | 14 | 600 | 136 |
| EXAMPLE 104 | 46.2 | 39.5 | 12 | 2 | 0.3 | 15 | 70 | 100 |
| EXAMPLE 105 | 48 | 38.6 | 12 | 1 | 0.4 | 16 | 30 | 122 |
| EXAMPLE 106 | 46.7 | 40.6 | 12 | 0.5 | 0.2 | 14 | 70 | 112 |
| EXAMPLE 107 | 46.7 | 40.55 | 12 | 0.5 | 0.25 | 14 | 30 | 136 |
| EXAMPLE 108 | 47 | 40 | 12 | 0.8 | 0.2 | 13 | 20 | 136 |

ELECTRONIC COMPONENT INCLUDING A MAGNETIC LAYER AND A DIELECTRIC LAYER

TECHNICAL FIELD

The present invention relates to an electronic component or an electronic part having a base member formed by joining a dielectric portion and a magnetic portion. The present invention relates to an electronic component or an electronic part which is preferably usable, for example, for an LC filter.

BACKGROUND OF THE INVENTION

In recent years, an FM radio receiver and/or an FM transmitter may be carried on a portable device (including an electronic device) such as a mobile phone. In this case, it is necessary for the portable device to provide a filter which allows a signal in the FM band to pass therethrough in addition to a filter which allows a signal in the ordinarily used frequency band to pass therethrough.

A dielectric filter has been hitherto used as the filter which allows the signal in the FM band to pass therethrough.

The conventional dielectric filter includes, for example, a filter disclosed, for example, in Patent Document 1. However, this filter is provided in order to attenuate the spurious at a level of 500 MHz. It is true that a signal at 76 to 108 MHz including the FM band is allowed to pass the filter. However, the filter is not for attenuating the signal in the high frequency band, for example, at 800 MHz, 1.4 GHz, 1.9 GHz, 2.5 GHz, and 5 GHz as the frequency band ordinarily used by a portable device.

Therefore, it is obvious that the noise in the high frequency band cannot be suppressed when the FM radio receiver and/or the FM transmitter is carried on the portable device.

As for the value of the inductance required for the filter, the lower the frequency is, the larger the required value is. When a coil is formed with a filter having a passband in the vicinity of 100 MHz, it is necessary to increase the number of turns and/or increase the size of the coil in order to obtain the required inductance.

The required inductance is obtained by increasing the number of turns of the coil. However, because the conductor resistance of the coil is increased, the Q characteristic is consequently deteriorated, failing to obtain suitable filter characteristic. Further, because stray components disadvantageously appear, and suitable attenuation characteristic is not obtained. Furthermore, because the area of the coil is increased, it is impossible to realize a compact size. By contrast, the portable device on which the filer is carried is required to be compact in size. In relation thereto, the dimension of the conventional filter is so large, i.e., 4.8 mm×3.5 mm, that it is not usable for the portable device.

In the conventional technique, a stacked type electronic part which has a base member obtained by joining a dielectric layer and a magnetic layer (see, for example, Patent Document 2) has been proposed. However, the stacked type electronic part is provided only to suppress warpage, delamination, and cracks in the product by adding a dummy layer. It is unclear whether or not the stacked type electronic part makes it possible to carry the FM radio receiver and/or the FM transmitter on the portable device.

Patent Document 1: Japanese Patent No. 2505135;
Patent Document 2: Japanese Laid-Open Patent Publication No. 2003-37022.

DISCLOSURE SUMMARY OF THE INVENTION

An object of the present invention is to provide an electronic part which makes it possible to realize a compact size of the electronic part, to improve the characteristic thereof, and to carry an FM radio receiver and/or an FM transmitter, for example, on a portable device, by improving the stacked type electronic part having the base member obtained by joining the dielectric layer and the magnetic layer as described above.

According to the present invention, there is provided an electronic part having a base member constructed by joining a dielectric portion and a magnetic portion, wherein a passband is a band of 76 to 108 MHz or a part thereof, and attenuation from 200 MHz to 6 GHz is not less than 10 dB. In this case, because the base member has a dimension of not more than 2.0 mm×1.25 mm×1 mm, it can be usable for a portable device.

Accordingly, for example, an FM radio receiver and/or an FM transmitter can be carried on a portable device.

The dielectric portion is composed of one dielectric layer or a plurality of dielectric layers. The magnetic portion is composed of one magnetic layer or a plurality of magnetic layers.

It is preferable that a magnetic material, which constitutes the magnetic portion, is ferrite having an initial magnetic permeability of not less than 10 at a frequency of not more than 150 MHz. Accordingly, the passband at 76 to 108 MHz can be secured with low loss.

In this case, it is preferable that the magnetic material, which constitutes the magnetic portion, is ferrite containing a main component of a composition in which NiO is 31 to 42 mol %, ZnO is 2 to 10 mol %, $Fe_2O_3$ is 43 to 48 mol %, $Co_3O_4$ is 0.5 to 3 mol %, and CuO is 10 to 14 mol %.

Alternatively, it is preferable that the magnetic material, which constitutes the magnetic portion, is ferrite containing a main component of a composition in which NiO is 37.4 to 42.2 mol %, ZnO is 0.01 to 3.6 mol %, $Fe_2O_3$ is 46.2 to 48 mol %, $Co_3O_4$ is 0.1 to 0.8 mol %, and CuO is 10 to 14 mol %. In this case, it is possible to obtain a filter which is suitable in both of the temperature characteristic and the high frequency characteristic.

It is preferable that a dielectric material, which constitutes the dielectric portion, contains a main component of a composition in $xBaO \cdot y_1Nd_2O_3 \cdot y_2Bi_2O_3 \cdot zTiO_2$, wherein:

$$0.09 \leq x \leq 0.25$$

$$0.05 \leq y_1 \leq 0.20$$

$$0 < y_2 \leq 0.10$$

$$0.60 \leq z \leq 0.75.$$

Further, it is preferable that the base member has a joint portion disposed between the dielectric portion and the magnetic portion; and a material, which constitutes the joint portion, is a dielectric based on $BaO-TiO_2-ZnO$.

As explained above, according to the electronic part of the present invention, it is possible to miniaturize the electronic part and improve the characteristics thereof. For example, the electronic part makes it possible to carry an FM radio receiver and/or an FM transmitter on a portable device.

BRIEF DESCRIPTION OF THE DRAWINGS

FIG. 10 is a table illustrating results of a first experimental example in relation to a filter concerning a second embodiment (measurement of the dielectric characteristic when base members are manufactured by changing the composition (x, $y_1$, $y_2$, and z) in $xBaO \cdot y_1Nd_2O_3 \cdot y_2Bi_2O_3 \cdot zTiO_2$;

FIG. 11 is a table illustrating preferred Examples of dielectric materials for constructing the joint portion;

FIG. 12 is a table illustrating results of a second experimental example in relation to the filter concerning the second embodiment (measurement of the initial magnetic permeability and the high frequency characteristic when base members are manufactured with different composition of NiO, ZnO, $Fe_2O_3$, $Co_3O_4$, and CuO);

FIG. 24 is a table illustrating results of a sixth experimental example in relation to the filter of the third embodiment (measurement of the initial magnetic permeability, the temperature coefficient, and the high frequency characteristic when base members are manufactured with different composition of NiO, ZnO, $Fe_2O_3$, $Co_3O_4$, and CuO).

DETAILED DESCRIPTION OF THE INVENTION

An explanation will be made below with reference to FIGS. 1 to 24 showing embodiments in which the electronic part according to the present invention is applied, for example, to a filter for an FM radio receiver and/or an FM transmitter.

Figure 1:
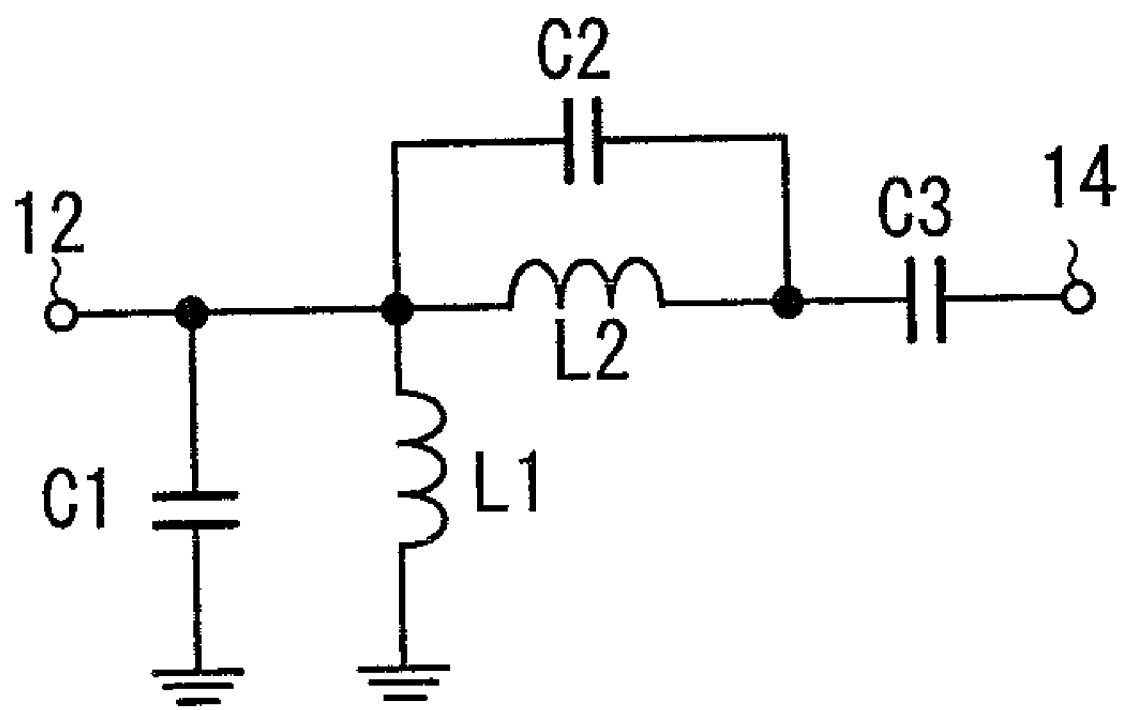
FIG. 1 is a circuit diagram illustrating a filter according to an embodiment of the present invention.

As shown in FIG. 1, a filter 10 according to this embodiment basically has a circuit structure in which a first capacitor C1 and a first coil L1 are connected in parallel between an input terminal 12 and the ground, a second capacitor C2 and a third capacitor C3 are connected in series between the input terminal 12 and an output terminal 14, and a second coil L2 is connected in parallel to both ends of the second capacitor C2.

Figure 2:
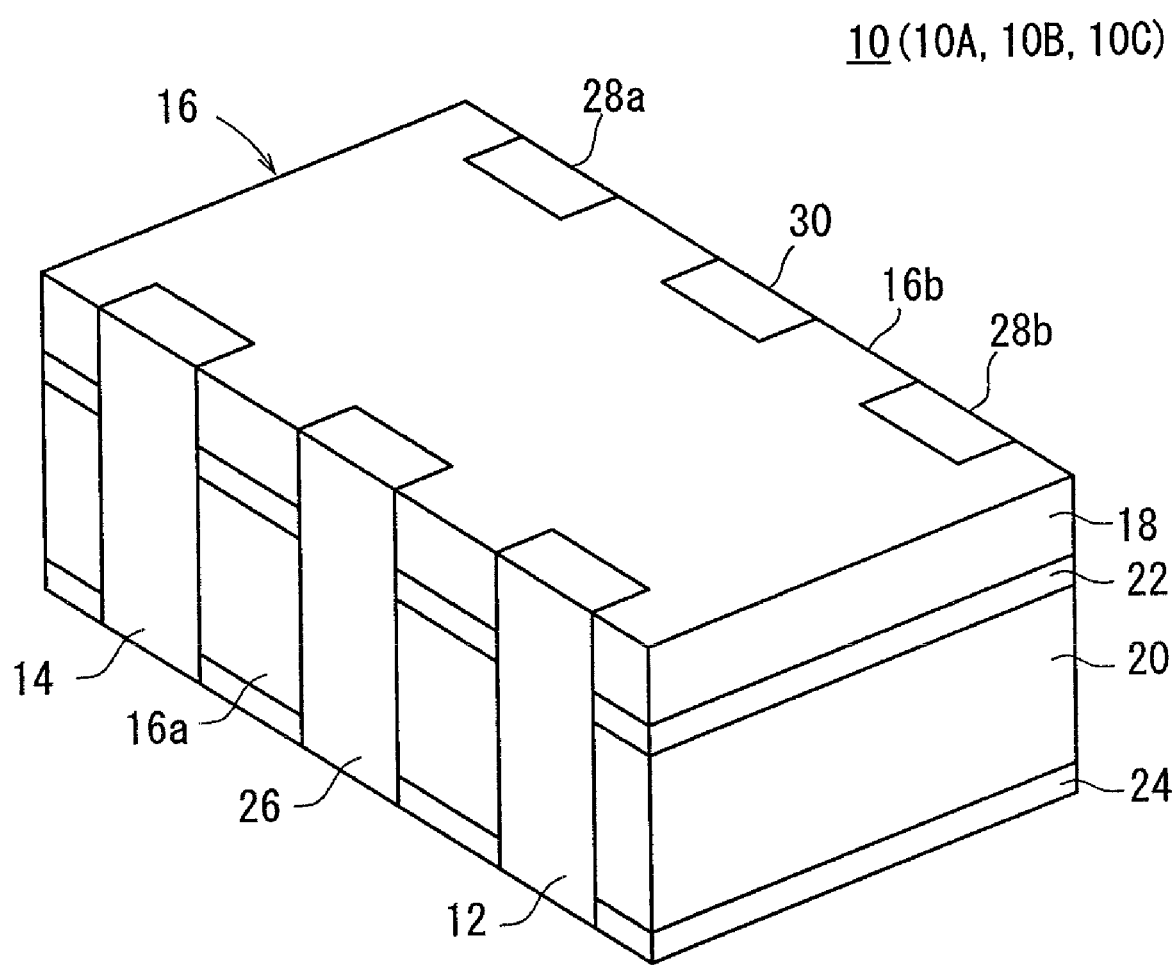
FIG. 2 is a perspective view illustrating an appearance of the filter according to the embodiment of the present invention.

Specifically, as shown in FIG. 2, a base member 16 is provided. The base member 16 is formed by sintering and integrating a dielectric portion 18, a magnetic portion 20, a joint portion 22 which joins the dielectric portion 18 and the magnetic portion 20, and a dummy portion 24 which is joined to a lower portion of the magnetic portion 20.

The dummy portion 24 is formed in order to suppress warpage, delamination, and cracks in the base member 16 as described in Patent Document 2 as well. Reference may be made to Patent Document 2 in relation to, for example, the selection of materials.

Three embodiments will now be explained with reference to FIGS. 3 to 24 about the filter 10 according to this embodiment.

At first, a filter 10A according to a first embodiment will be explained with reference to FIGS. 1 to 9.

Figure 3:
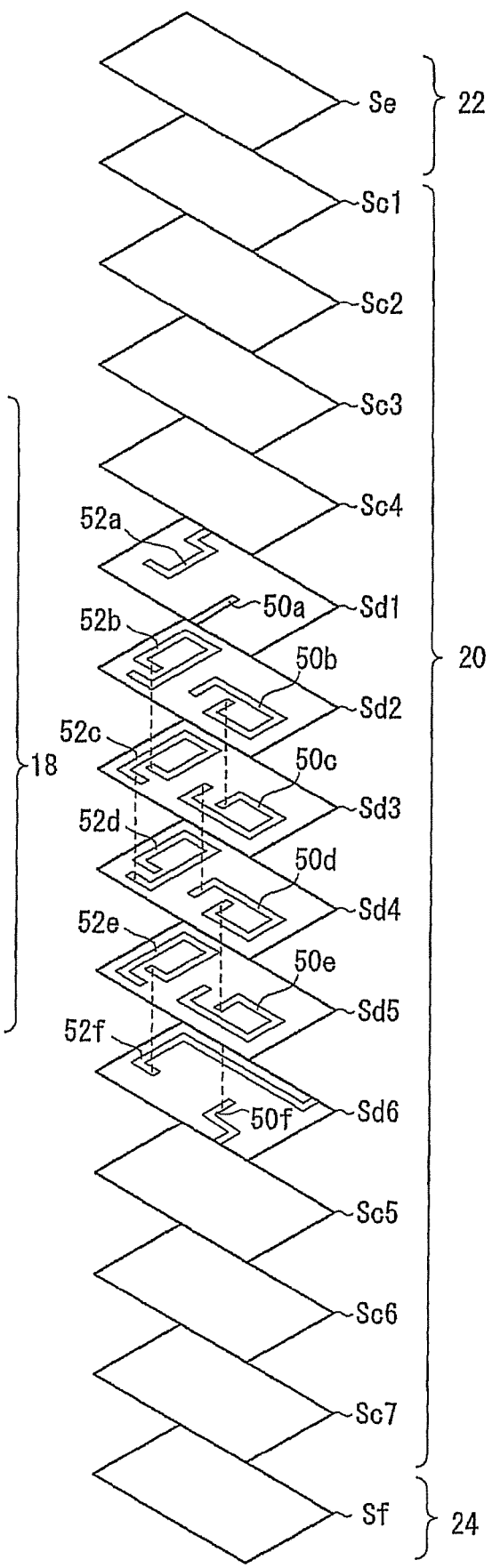
FIG. 3 is an exploded perspective view illustrating a filter according to a first embodiment.

As shown in FIG. 3, in the filter 10A according to the first embodiment, the dielectric portion 18 is formed by stacking a plurality of dielectric layers. In detail, there are provided a first dummy layer Sa1, a second dummy layer Sa2, first to fourth capacitor electrode layers Sb1 to Sb4, and a third dummy layer Sa3 in this order from the top. Each of the first dummy layer Sa1, the second dummy layer Sa2, the first to fourth capacitor electrode layers Sb1 to Sb4, and the third dummy layer Sa3 is constructed by one layer or a plurality of layers.

The magnetic portion 20 is constructed by stacking a plurality of magnetic layers. In detail, there are provided first to fourth dummy layers Sc1 to Sc4, first to sixth coil electrode layers Sd1 to Sd6, and fifth to seventh dummy layers Sc5 to Sc7 in this order from the top. Each of the first to fourth dummy layers Sc1 to Sc4, the first to sixth coil electrode layers Sd1 to Sd6, and the fifth to seventh dummy layers Sc5 to Sc7 is constructed by one layer or a plurality of layers.

The joint portion 22 is constructed by one intermediate layer Se. The intermediate layer Se is constructed by one layer or a plurality of layers.

The dummy portion 24 is constructed by one dummy layer Sf. The dummy layer Sf is constructed by one layer or a plurality of layers.

Each of the first to third dummy layers Sa1 to Sa3 of the dielectric portion 18 and the first to seventh dummy layers Sc1 to Sc7 of the magnetic portion 20 is formed in order to suppress the occurrence of warpage, delamination, and cracks of the base member 16 in the same manner as in the dummy portion 24.

As shown in FIG. 2, the input terminal 12, a ground terminal 26, and the output terminal 14 are formed on a first side surface 16a of the base member 16. A first connecting terminal 28a, a second connecting terminal 28b, and an NC (Non-connection) terminal 30 are formed on a second side surface 16b (side surface opposite to the first side surface 16a) of the base member 16.

As shown in FIG. 3, various electrode layers are formed on the first to fourth capacitor electrode layers Sb1 to Sb4 and the first to sixth coil electrode layers Sd1 to Sd6. Details thereof will be explained below. At first, a first ground electrode 32 having one end connected to the ground terminal 26, and a first capacitor electrode 34 having one end connected to the first connecting terminal 28a are formed on a principal surface of the first capacitor electrode layer Sb1. The first capacitor electrode 34 has a protruding portion 34a which protrudes toward the first ground electrode 32.

A second capacitor electrode 36 having one end connected to the input terminal 12 and the other end connected to the second connecting terminal 28b, and a third capacitor electrode 38 having one end connected to the output terminal 14 are formed on a principal surface of the second capacitor electrode layer Sb2. The second capacitor electrode 36 has a protruding portion 36a which protrudes toward the third capacitor electrode 38.

A second ground electrode 40 and a fourth capacitor electrode 42, which are similar to the first ground electrode 32 and the first capacitor electrode 34 formed on the first capacitor electrode layer Sb1, are formed on a principal surface of the third capacitor electrode layer Sb3. The fourth capacitor electrode 42 has a protruding portion 42a which protrudes toward the second ground electrode 40.

A fifth capacitor electrode 44 and a sixth capacitor electrode 46, which are similar to the second capacitor electrode 36 and the third capacitor electrode 38 formed on the second capacitor electrode layer Sb2, are formed on a principal surface of the fourth capacitor electrode layer Sb4. The fifth capacitor electrode 44 has a protruding portion 44a which protrudes toward the sixth capacitor electrode 46.

On the other hand, first to sixth coil electrodes 50a to 50f for forming the first coil L1 respectively and seventh to twelfth coil electrodes 52a to 52f for forming the second coil L2 respectively are formed on respective principal surfaces of the first to sixth coil electrode layers Sd1 to Sd6. The first coil electrode 50a, which is formed on the principal surface of the first coil electrode layer Sd1, has one end which is connected to the ground terminal 26. The seventh coil electrode 52a has one end which is connected to the first connecting terminal 28a. The sixth coil electrode 50f, which is formed on the principal surface of the sixth coil electrode layer Sd6, has one end which is connected to the input terminal 12. The twelfth coil electrode 52f has one end which is connected to the second connecting terminal 28b. Further, the first to sixth coil electrodes 50a to 50f are electrically connected to one another via via-holes respectively. The seventh to twelfth coil electrodes 52a to 52f are electrically connected to one another via via-holes respectively.

With this structure, the first capacitor C1 shown in FIG. 1 is formed by the combined capacitance of the capacitance formed by the first ground electrode 32 and the second capacitor electrode 36 opposed to the first ground electrode 32, the capacitance formed by the second ground electrode 40 and the second capacitor electrode 36 opposed to the second ground electrode 40, and the capacitance formed by the second ground electrode 40 and the fifth capacitor electrode 44 opposed to the second ground electrode 40.

Similarly, the second capacitor C2 shown in FIG. 1 is a combined capacitance of the capacitance formed by the protruding portion 34a of the first capacitor electrode 34 and the protruding portion 36a of the second capacitor electrode 36 opposed to the protruding portion 34a, the capacitance formed by the protruding portion 36a of the second capacitor electrode 36 and the protruding portion 42a of the fourth capacitor electrode 42 opposed to the protruding portion 36a, and the capacitance formed by the protruding portion 42a of the fourth capacitor electrode 42 and the protruding portion 44a of the fifth capacitor electrode 44 opposed to the protruding portion 42a.

Further, the third capacitor C3 shown in FIG. 1 is a combined capacitance of the capacitance formed by the first capacitor electrode 34 and the third capacitor electrode 38 opposed to the first capacitor electrode 34, the capacitance formed by the third capacitor electrode 38 and the fourth capacitor electrode 42 opposed to the third capacitor electrode 38, and the capacitance formed by the fourth capacitor electrode 42 and the sixth capacitor electrode 46 opposed to the fourth capacitor electrode 42.

The first coil L1 shown in FIG. 1 is formed by the first to sixth coil electrodes 50a to 50f. The second coil L2 shown in FIG. 1 is formed by the seventh to twelfth coil electrodes 52a to 52f. In particular, in the first embodiment, the first coil electrode 50a is electrically connected to the twelfth coil electrode 52f via the input terminal 12, the second capacitor electrode 36, the fifth capacitor electrode 44, and the second connecting terminal 28b.

Figure 4:
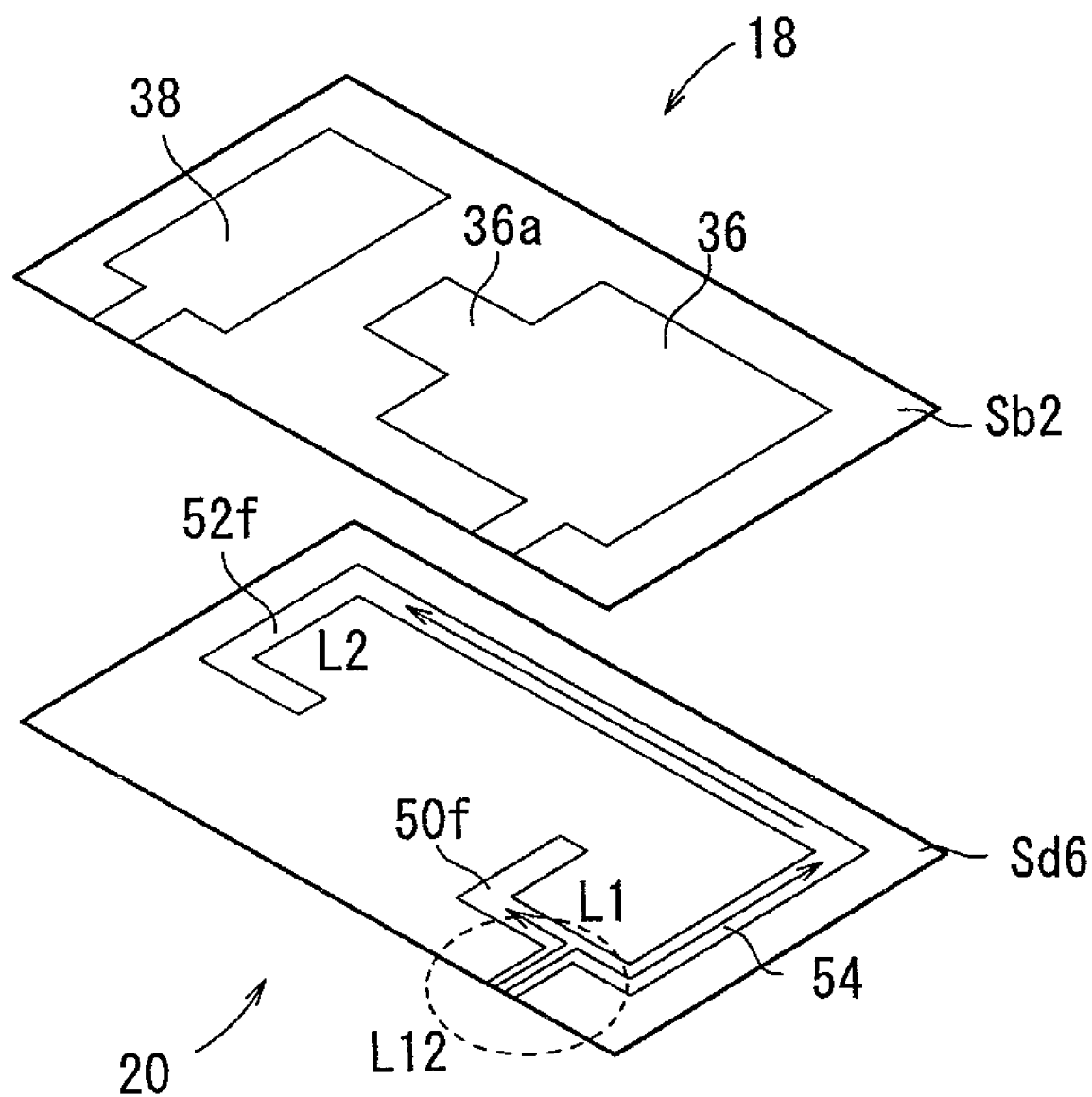
FIG. 4 is a perspective view illustrating an example of ordinary electric connection in relation to a first coil and a second coil.

For example, when the first coil L1 and the second coil L2 are electrically connected to one another, as shown in FIG. 4, the sixth coil electrode 50f for forming the first coil L1 and the twelfth coil electrode 52f for forming the second coil L2 are electrically connected to one another via a lead electrode 54 in the magnetic portion 20.

Figure 5A:
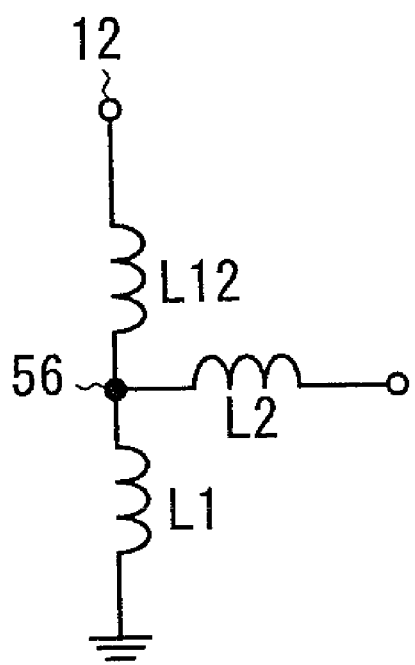
FIGS. 5A and 5B are views showing the function brought about by the example connection shown in FIG. 4.
Figure 5B:
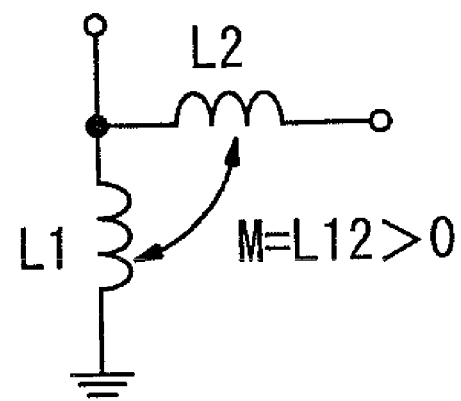

However, in this case, when viewed equivalently as shown in FIG. 5A, a third coil L12 is connected between the input terminal 12 and the connection point 56 of the first coil L1 and the second coil L2. As a result, the first coil L1 and the second coil L2 are positively coupled as shown in FIG. 5B. Therefore, when this electronic part is used as a filter, because the passband of the filter may undesirably be narrowed, it is impossible to obtain any desired frequency characteristic.

Figure 6:
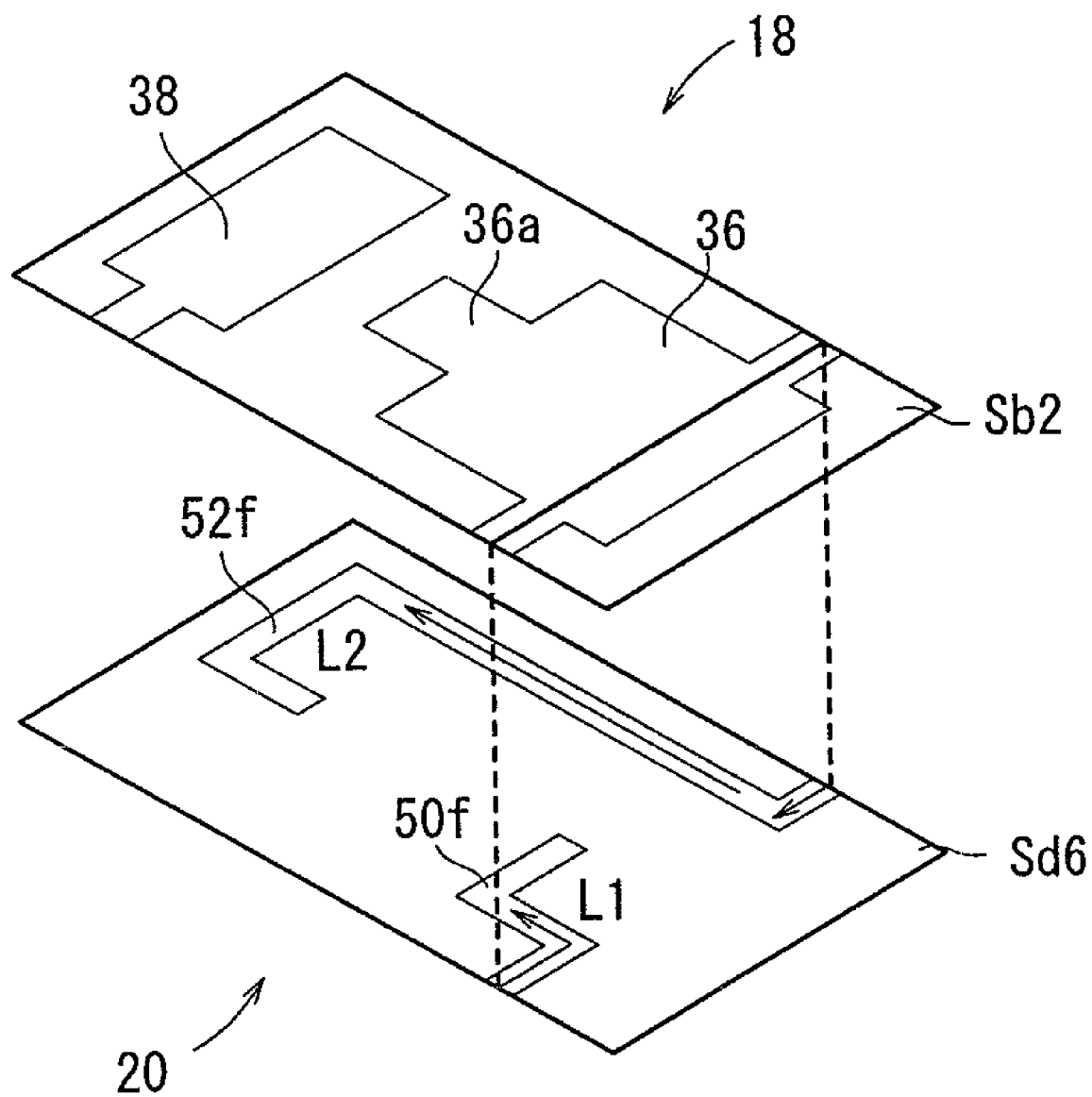
FIG. 6 is a perspective view illustrating an example of electric connection in relation to a first coil and a second coil in the filter according to the first embodiment.
Figure 7:
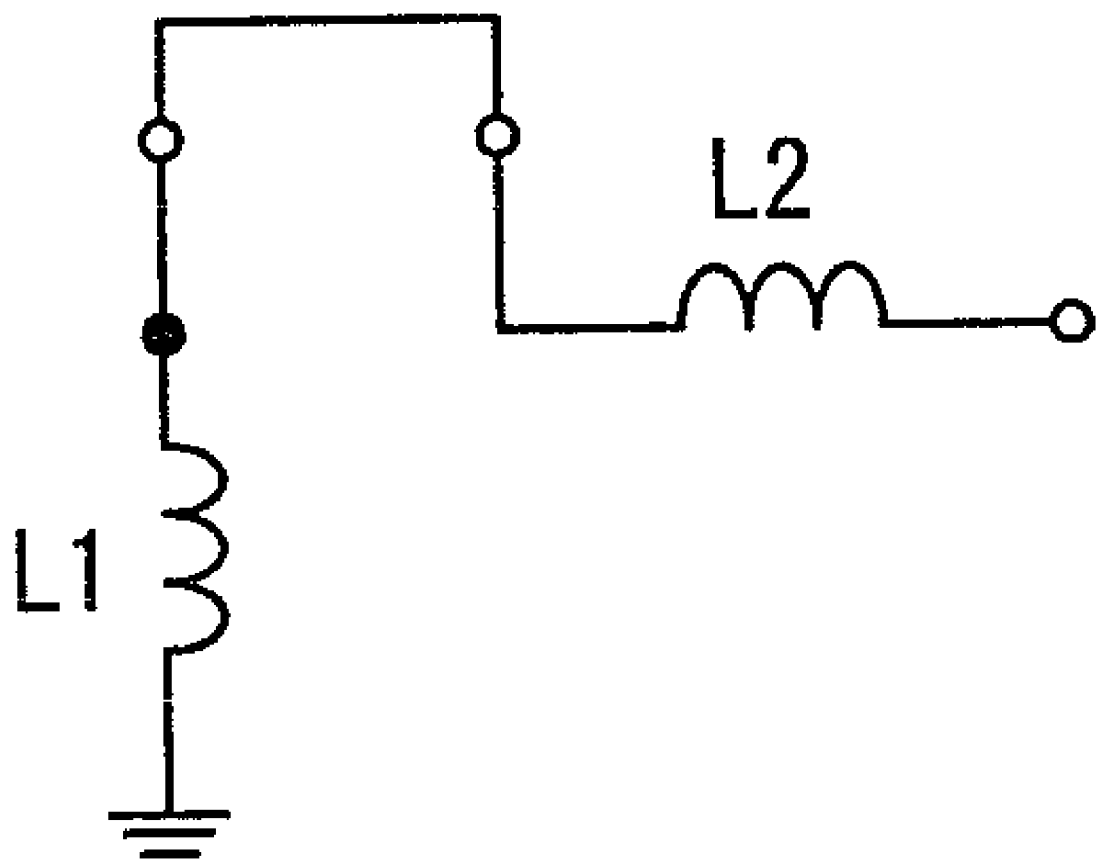
FIG. 7 is a view showing the function brought about by the example shown in FIG. 6.

On the other hand, in the case of the filter 10A according to the first embodiment, as partially shown in FIG. 6, the sixth coil electrode 50f for forming the first coil L1 and the twelfth coil electrode 52f for forming the second coil L2 are electrically connected to one another, for example, via the second capacitor electrode 36 formed on the second capacitor electrode layer Sb2. Therefore, as shown in FIG. 7, the magnetic permeability of the dielectric portion 18 is significantly smaller than the magnetic permeability of the magnetic portion 20 (for example, magnetic permeability μ=1). Therefore, the coupling between the first coil L1 and the L2, which can be shown in the equivalent circuit, can be decreased to such an extent that the coupling between the first coil L1 and the L2 is negligible. It is possible to obtain the desired frequency characteristic.

Figure 8:
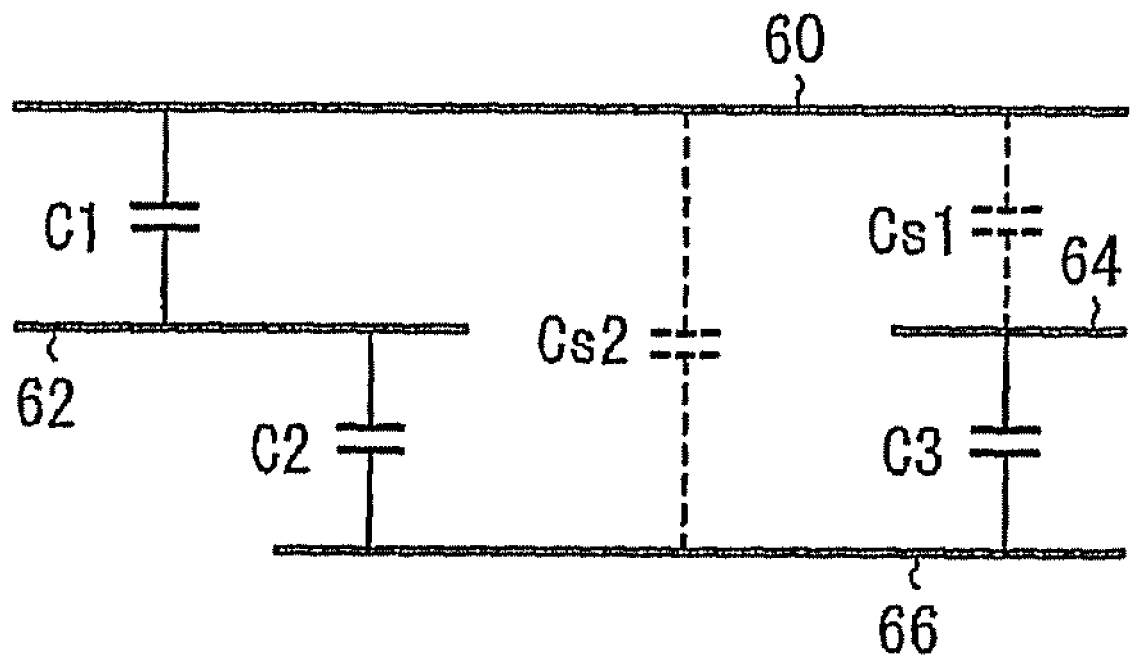
FIG. 8 is a view showing an example of ordinary stacking of electrodes for forming first to third capacitors and the function thereof.

When the first to third capacitors C1 to C3 shown in FIG. 1 are formed, as shown in FIG. 8, for example, a ground electrode 60 is formed on the substantially entire principal surface of the first dielectric layer, a first electrode 62 and a second electrode 64 are formed on the principal surface of the second dielectric layer, and a third electrode 66 is formed on the principal surface of the third dielectric layer. In this case, a first capacitor C1 is formed between the ground electrode 60 and the first electrode 62, a second capacitor C2 is formed between the first electrode 62 and the third electrode 66, and a third capacitor C3 is formed between the second electrode 64 and the third electrode 66.

However, when the ground electrode 60 is wide, the ground electrode 60 is also opposed to the two electrodes (second electrode 64 and third electrode 66) which do not relate to the formation of the first capacitor C1. As a result, stray capacitances Cs1, Cs2 are generated between the ground electrode 60 and the second electrode 64 and between the ground electrode 60 and the third electrode 66 respectively. The high frequency attenuation characteristic may undesirably be deteriorated.

Figure 9:
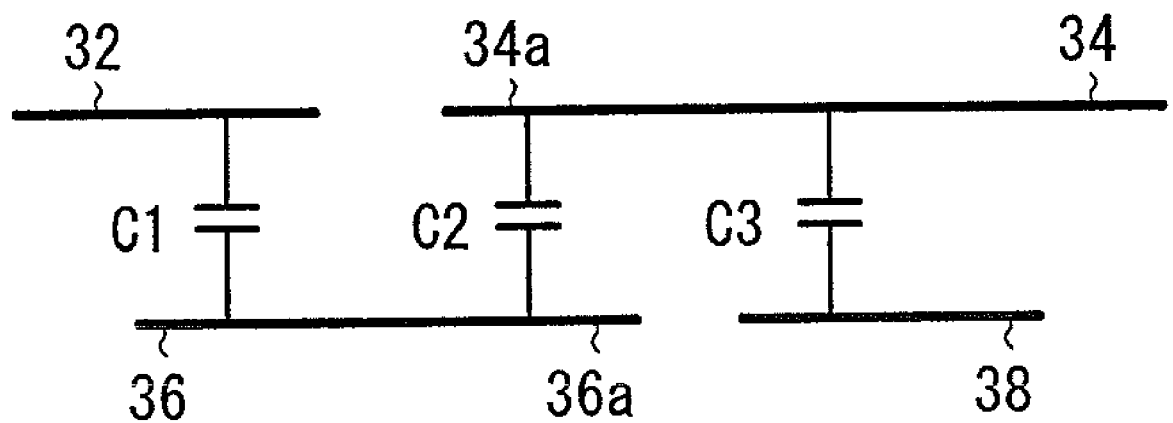
FIG. 9 is a view showing an example of stacking of electrodes for forming first to third capacitors and the function thereof in the filter according to the first embodiment.

On the other hand, in the case of the filter 10A according to the first embodiment, as partially shown in FIG. 9. The first ground electrode 32 and the first capacitor electrode 34 are formed on the first capacitor electrode layer Sb1 of the dielectric portion 18 respectively. The second capacitor electrode 36 and the third capacitor electrode 38 are formed on the second capacitor electrode layer Sb2 respectively. The first ground electrode 32 and the second capacitor electrode 36 are opposed to one another. The second capacitor electrode 36 and the third capacitor electrode 38 are opposed to the first capacitor electrode 34. Therefore, the first ground electrode 32 is not opposed to the two electrodes (first capacitor electrode 34 and third capacitor electrode 38) which do not relate to the formation of the first capacitor C1. As a result, no stray capacitance appears between the first ground electrode 32 and the first capacitor electrode 34 and between the first ground electrode 32 and the third capacitor electrode 38 respectively. It is possible to suppress the deterioration of the high frequency attenuation characteristic.

Further, when the combination shown in FIG. 9 is regarded as one arrangement pattern, the two arrangement patterns are aligned in the stacking direction of the dielectric layers in the dielectric portion 18 in the filter 10A according to the first embodiment shown in FIG. 3. Therefore, it is possible to increase the respective capacitances of the first to third capacitors C1 to C3. It is possible to further improve the high frequency attenuation characteristic. Of course, it is also allowable to stack three or more of the arrangement patterns.

Next, a filter 10B according to a second embodiment will be explained with reference to FIGS. 10 to 19.

In the filter 10B according to the second embodiment, the materials are specified for the dielectric portion 18, the magnetic portion 20, and the joint portion 22 shown in FIG. 2.

Specifically, the dielectric material for forming the dielectric portion 18 contains a main component of a composition in $xBaO.y_1Nd_2O_3.y_2Bi_2O_3.zTiO_2$, wherein:

$0.09 \leq x \leq 0.25$ $0.05 \leq y_1 \leq 0.20$ $0 < y_2 \leq 0.10$ $0.60 \leq z \leq 0.75$.

The reason thereof will be explained on the basis of results of a first experimental example shown in FIG. 10 (Examples 1 to 13 and Comparative Examples 1 to 6). In the first experimental example, the dielectric characteristic is measured when the base member 16 is manufactured with different the composition (x, $y_1$, $y_2$, and z) in $xBaO.y_1Nd_2O_3.y_2Bi_2O_3.zTiO_2$. The results are shown in FIG. 10.

In general, when the dielectric material has a high dielectric constant, the base member 16 is preferably miniaturized. However, according to the results shown in FIG. 10, it is preferable that the dielectric constant is not less than 60 and not more than 120. If the dielectric constant is less than 60, the effect of miniaturization is insufficient (see Comparative Example 1). If the dielectric constant exceeds 120, then the dimension is excessively decreased, the deficiency in the conductor printing arises, and the yield is lowered (see Comparative Examples 2 and 3).

It is preferable that the temperature coefficient ($\tau\in$) of the dielectric constant is not more than 100 ppm/° C. as the absolute value as well. If the temperature coefficient exceeds this value, temperature change adversely affects the operation a lot at cold and hot places (see Comparative Examples 2 to 6).

The dielectric material, which satisfies the characteristics as described above, is preferably the dielectric having the composition of $xBaO.y_1Re_2O_3.y_2Bi_2O_3.zTiO_2$ (Re: rare earth) in which the crystalline phase is of the pseudo-tungsten-bronze type. The composition is within the foregoing range.

In detail, if BaO is decreased, the dielectric constant is lowered. If BaO is excessively increased, the absolute value of the temperature coefficient is increased. If $Bi_2O_3$ is lowered, then sintering at a low-temperature is difficult, and the dielectric constant is lowered as well. If $Bi_2O_3$ is excessively increased, the temperature coefficient is increased. If $TiO_2$ is increased, the dielectric constant is lowered. If $TiO_2$ is decreased, the temperature coefficient is increased.

In order to allow the sintering temperature to be in the vicinity of 900° C., about 0.1 to 5% by weight of glass may be added. The glass includes, for example, $B_2O_3$—$SiO_2$ based glass, ZnO—$SiO_2$—$B_2O_3$ based glass, and BaO—$SiO_2$—$B_2O_3$ based glass.

Half of Nd may be substituted with rare earth element such as La, Sm, and Pr.

Next, the dielectric material for forming the joint portion 22 is the BaO—$TiO_2$—ZnO based dielectric. Specifically, it is preferable for aBaO, bZnO, and $cTiO_2$ to satisfy the followings:

$4 \leq a \leq 45$ $12 \leq b \leq 45$ $a+b+c=100$.

Preferred example of compositions (Examples 14 to 18) is shown in FIG. 11.

With the composition in this range, it is possible to decrease the diffusion of the element between the magnetic portion 20 and the dielectric portion 18, and stabilize the junction.

The magnetic material for forming the magnetic portion 20 is ferrite having an initial magnetic permeability of not less than 10 at a frequency of not more than 150 MHz.

Specifically, it is preferable that the magnetic material is ferrite containing a main component of a composition in which NiO is 31 to 42 mol %, ZnO is 2 to 10 mol %, $Fe_2O_3$ is 43 to 48 mol %, $Co_3O_4$ is 0.5 to 3 mol %, and CuO is 10 to 14 mol %.

More preferably, the magnetic material is ferrite containing a main component of a composition in which NiO is 33 to 41 mol %, ZnO is 3 to 7 mol %, $Fe_2O_3$ is 44 to 46 mol %, $Co_3O_4$ is 1 to 3 mol %, and CuO is 11 to 13 mol %.

The reason thereof will be explained on the basis of results of a second experimental example shown in FIG. 12 (Examples 19 to 27 and Comparative Examples 7 to 16). In the second experimental example, the initial magnetic permeability and the high frequency characteristic (frequency at which Q=100) are measured when the base member 16 is manufactured by changing the composition for NiO, ZnO, $Fe_2O_3$, $Co_3O_4$, and CuO. The results are shown in FIG. 12.

If NiO is increased, then the high frequency characteristic (frequency for Q=100) is improved, but the initial magnetic permeability is lowered. Therefore, it is preferable that the lower limit of NiO is 31 mol %. If ZnO is increased, then the initial magnetic permeability is improved, but the high frequency characteristic is lowered. Therefore, the lower limit of ZnO is 2 mol %. Because the composition is determined to balance NiO and ZnO, the upper limits are determined respectively for the opposite reasons.

As for $Fe_2O_3$, because the composition is determined so that the crystalline structure of the magnetic portion is the spinel structure, the upper and lower limits are determined. The range is preferably 43 to 48 mol %. If the composition is outside this range, then hetero phase is formed so that the initial magnetic permeability and the high frequency characteristic are deteriorated.

$Co_3O_4$ is added in order to improve the high frequency characteristic. If the amount of $Co_3O_4$ added is less than 0.5 mol %, high frequency characteristic is not improved. If it exceeds 3 mol %, the initial magnetic permeability is inversely lowered.

CuO is added as a sintering aid in order to perform sintering at about 900° C. If CuO is less than 10 mol %, sufficient density is not obtained by the sintering at 900° C. If CuO exceeds 14 mol %, then the sintering is excessively advanced, and pores appear from the inside.

An explanation will now be made with reference to FIGS. 13 to 16 about two experimental examples (third and fourth experimental examples) for the selection of the compositions of ZnO and $Co_3O_4$.

Figure 15:
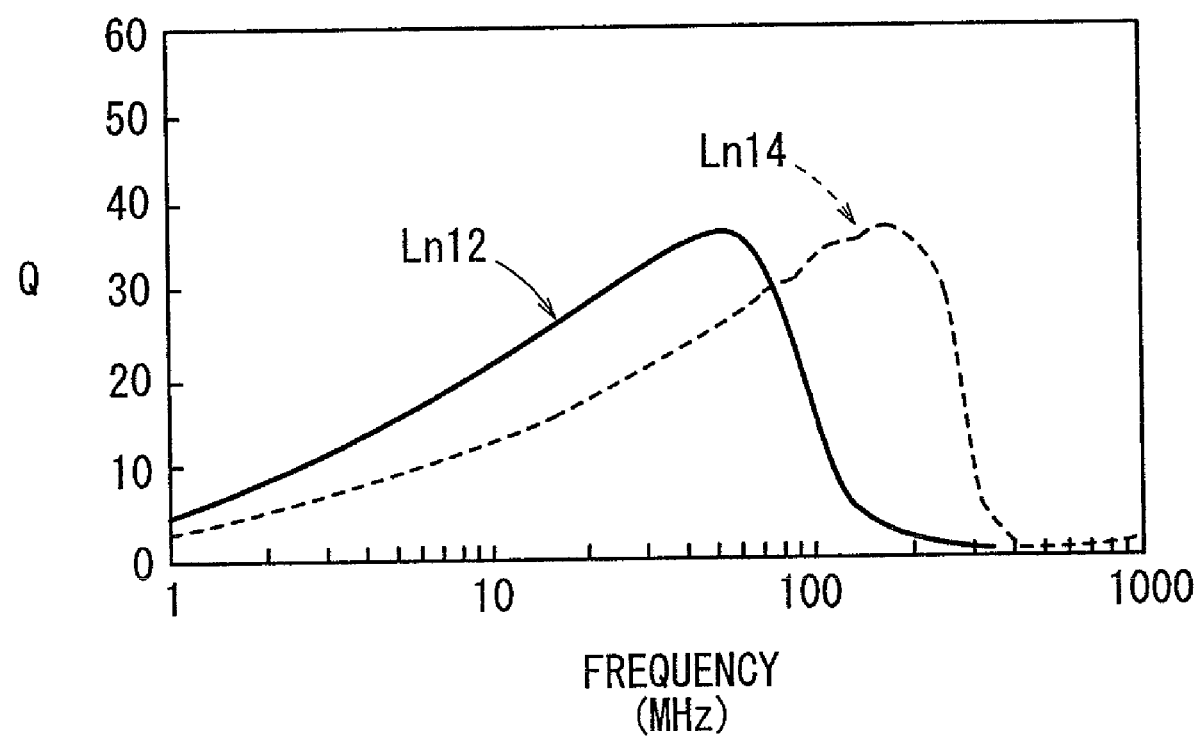
FIG. 15 is a graph illustrating results of Comparative Examples 14 and 16 in the third experimental example.

In the third experimental example, the change of Q with respect to the frequency (1 to 1,000 MHz) is observed in Example 24 and Comparative Examples 14 to 16. Results are shown in FIGS. 13 and 15.

Figure 14:
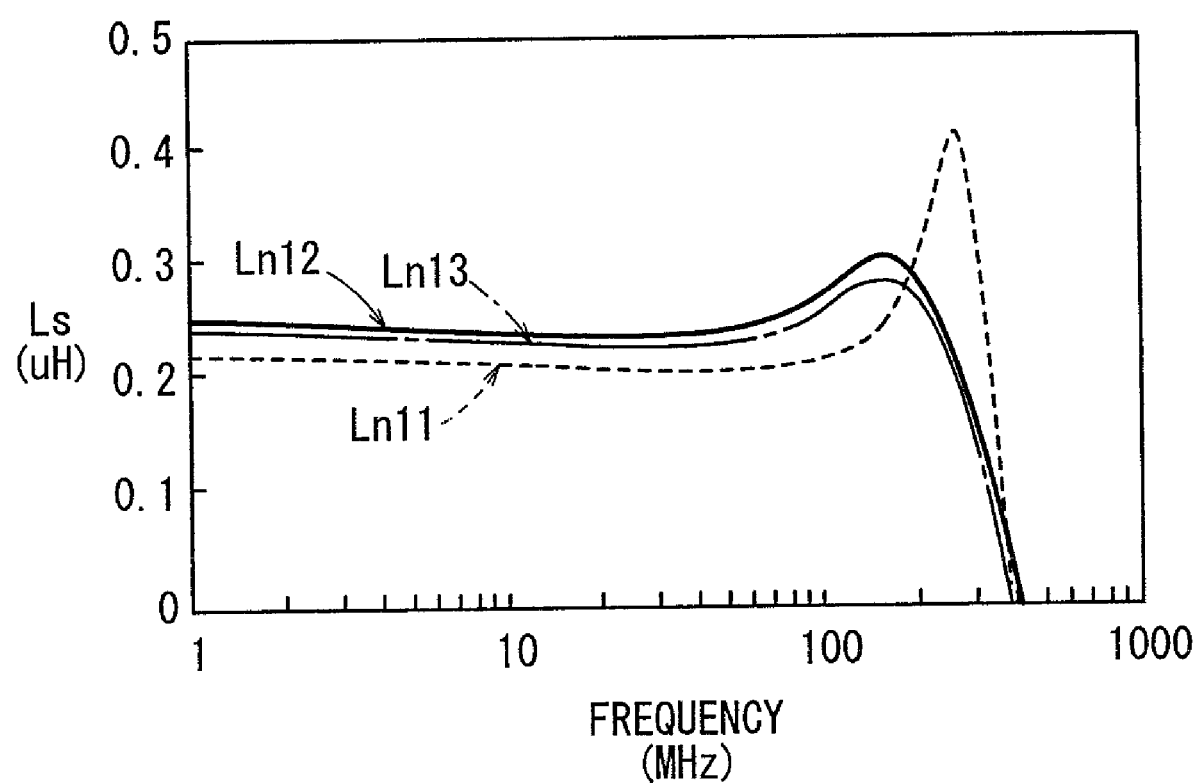
FIG. 14 is a graph illustrating results of Example 24 and Comparative Examples 14 and 15 in a fourth experimental example in relation to the filter concerning the second embodiment (change of the inductance value with respect to the frequency (1 to 1,000 MHz) concerning the selection of the composition of ZnO and $Co_3O_4$)
Figure 16:
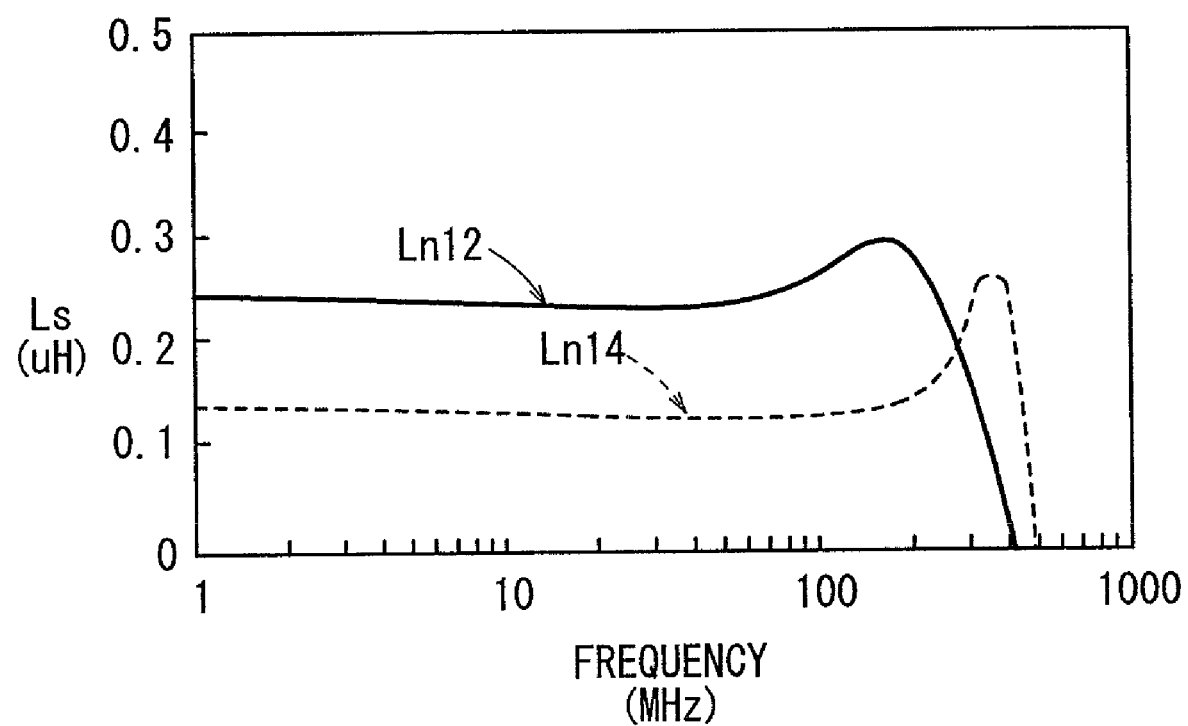
FIG. 16 is a graph illustrating results of Comparative Examples 14 and 16 in the fourth experimental example.

In the fourth experimental example, the change of the magnetic permeability (inductance) with respect to the frequency (1 to 1,000 MHz) is observed in Example 24 and Comparative Examples 14 to 16. Results are shown in FIGS. 14 and 16.

In FIGS. 13 to 16, the characteristic of Example 24 is indicated by the curve Ln11, the characteristic of Comparative Example 14 is indicated by the curve Ln12, the characteristic of Comparative Example 15 is indicated by the curve Ln13, and the characteristic of Comparative Example 16 is indicated by the curve Ln14.

Figure 13:
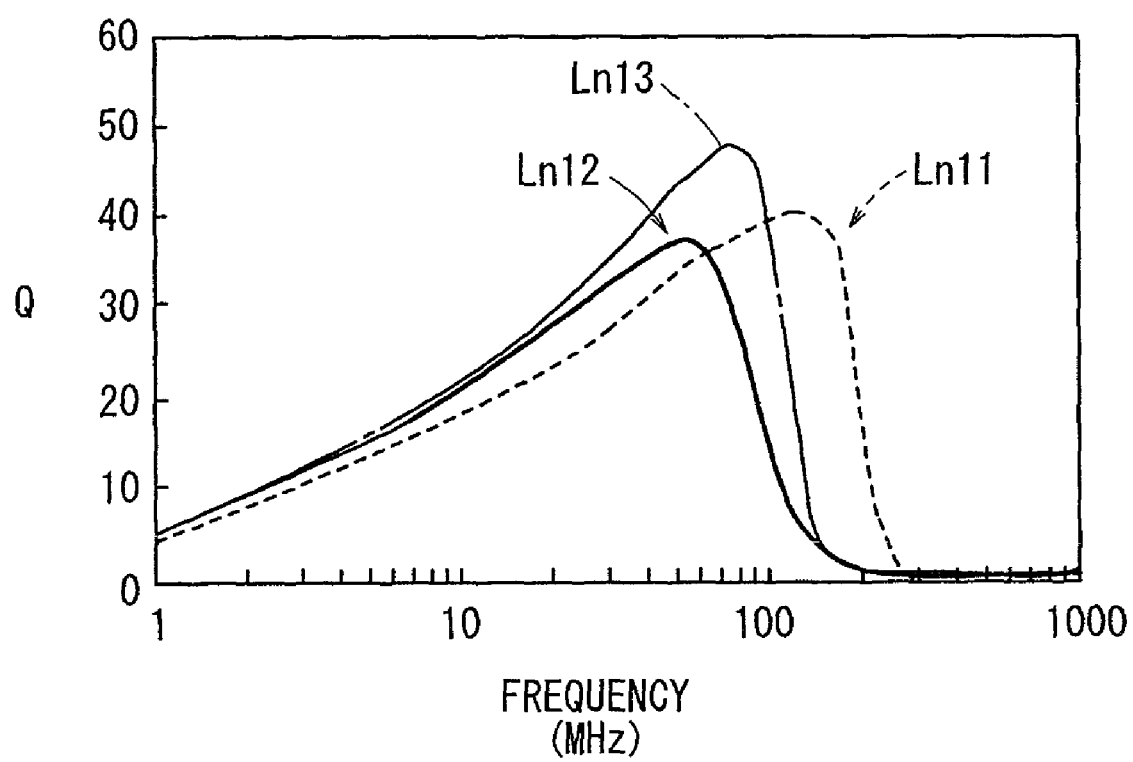
FIG. 13 is a graph illustrating results of Example 24 and Comparative Examples 14 and 15 in a third experimental example in relation to the filter of the second embodiment (change of Q with respect to the frequency (1 to 1,000 MHz) concerning the selection of the composition of ZnO and $Co_3O_4$)

The following fact was revealed from the results shown in FIGS. 13 to 16. At first, because $Co_3O_4$ is not added in Comparative Example 14 (curve Ln12), as shown in FIG. 13, Q is too small in the passband (FM band) of the filter for practical use.

In Comparative Example 15 (curve Ln13), $Co_3O_4$ is added by 0.3 mol %. As shown in FIG. 13, the frequency characteristic is improved as compared with Comparative Example 14 (curve Ln12). However, Q is at the peak in the vicinity of 75 MHz, and the curve is sharply lowered when it passes the peak. Therefore, it is also difficult to practically use. As shown in FIG. 14, the value of the inductance is substantially constant in Example 24 and Comparative Examples 14 and 15.

In Comparative Example 16 (curve Ln14) $Co_3O_4$ is added by 1.5 mol %. As shown in FIG. 15, Q is improved in the passband (FM band) of the filter. However, as shown in FIG. 16, the value of the inductance is extremely small.

In Example 24 (curve Ln11), ZnO is added by 4 mol %, and $Co_3O_4$ is added by 1.5 mol %. According to FIGS. 13 and 14, Q and the inductance are improved in the passband (FM band) of the filter.

The magnetic material is preferably the Ni—Zn based ferrite having the crystalline structure of the spinel type as described above. However, it is also possible to use hexagonal Ferrox planar ferrite.

Next, an explanation will be made below about an example of the method for producing the filter 10B according to the second embodiment. At first, a green sheet of the dielectric material and a green sheet of the magnetic material were manufactured respectively.

The green sheet of the dielectric material was manufactured as follows. That is, respective powders of high purity barium carbonate, strontium carbonate, neodymium oxide, and titanium oxide were weighed in accordance with the respective composition ratios of Examples 1 to 13 shown in FIG. 10. The raw material powders were introduced together with a zirconia ball into a pot made of alumina, and subject to wet blending with ethanol as a dispersion medium. The obtained mixture was taken out from the pot, dried and calcined at 1,200° C. for 2 hours in an air atmosphere. The calcined product was introduced together with an alumina ball into a pot made of alumina, and coarsely pulverized. After that, $B_2O_3$—$SiO_2$ based glass was added by 3% by weight, followed by being finely pulverized and dried to obtain a powder having an average particle size of about 0.3 µm. A known binder, a plasticizer, and a solvent were mixed with the powder to prepare a slurry. After adjusting the viscosity, the green sheet having a thickness of 0.05 mm was prepared by the doctor blade method.

On the other hand, the green sheet of the magnetic material was manufactured as follows. That is, predetermined amounts of respective raw materials of iron oxide ($Fe_2O_3$), nickel oxide, copper oxide, zinc oxide, and cobalt oxide were weighed, and they were introduced together with a zirconia ball into a pot made of alumina, and subjected to wet blending with ethanol as a dispersion medium. The obtained mixture was taken out from the pot, dried and calcined at 900° C. for 2 hours in an air atmosphere. The calcined product was introduced together with an alumina ball into a pot made of alumina, and coarsely pulverized. After that, the product was finely pulverized and dried to obtain a powder having an average particle size of about 0.5 µm. A known binder, a plasticizer, and a solvent were mixed with the powder to prepare a slurry. After adjusting the viscosity, the green sheet having a thickness of 0.05 mm was prepared by means of the doctor blade method.

After that, each of the green sheet of the dielectric material and the green sheet of the magnetic material was punched into 100×100 mm, and via-holes were formed with a laser. Subsequently, a conductor paste containing a main component of Ag was used to form a predetermined circuit pattern by the screen printing. The green sheets of the dielectric material and the green sheets of the magnetic material were stacked to provide a predetermined arrangement, pressed at a temperature of 80° C. and a pressure of 20 MPa. The laminate was cut, and then a conductor was printed on the end surface, and sintered so that the maximum temperature was 900° C. for 2 hours in the air to obtain the product (filter 10B according to the second embodiment).

Figure 17:
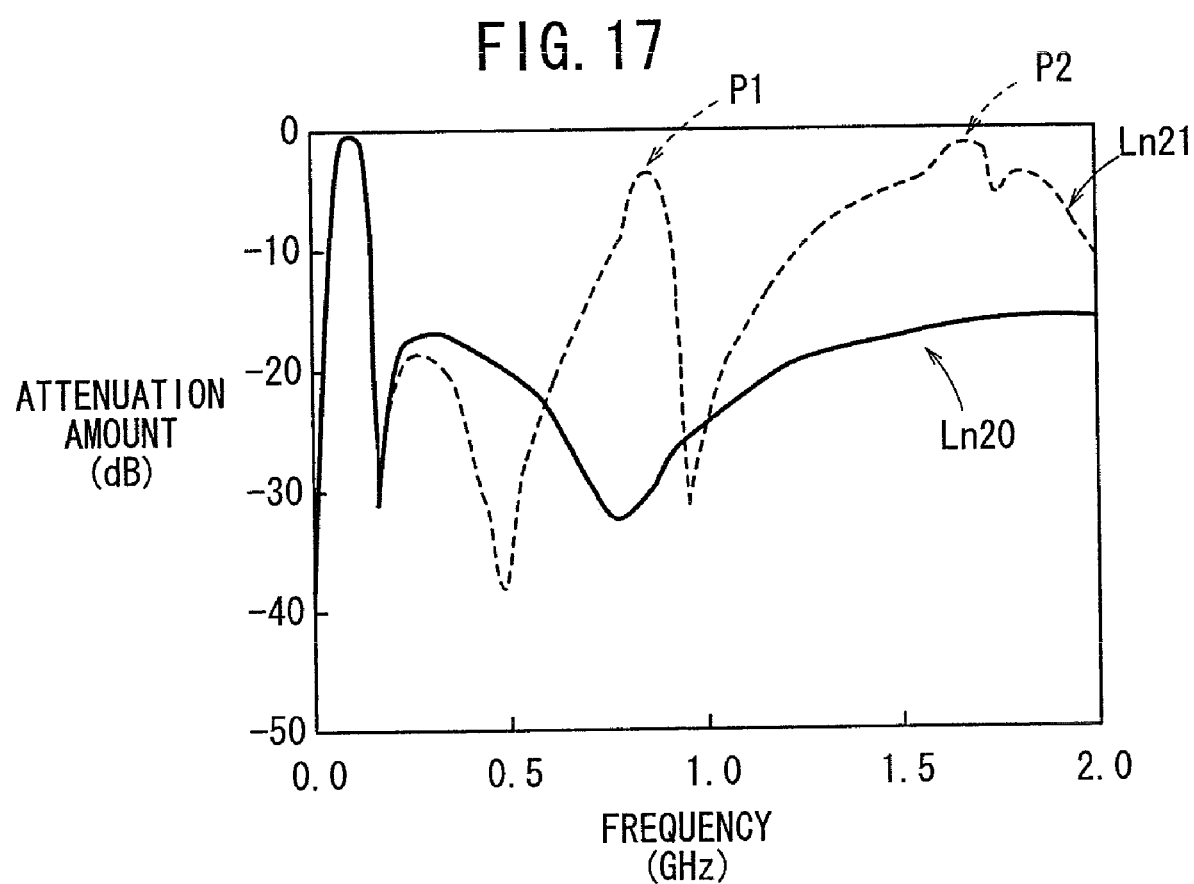
FIG. 17 is a view showing attenuation characteristic (0 to 2 GHz) of the filter of the second embodiment and a filter (conventional example) composed of a base member of a dielectric material.
Figure 18:
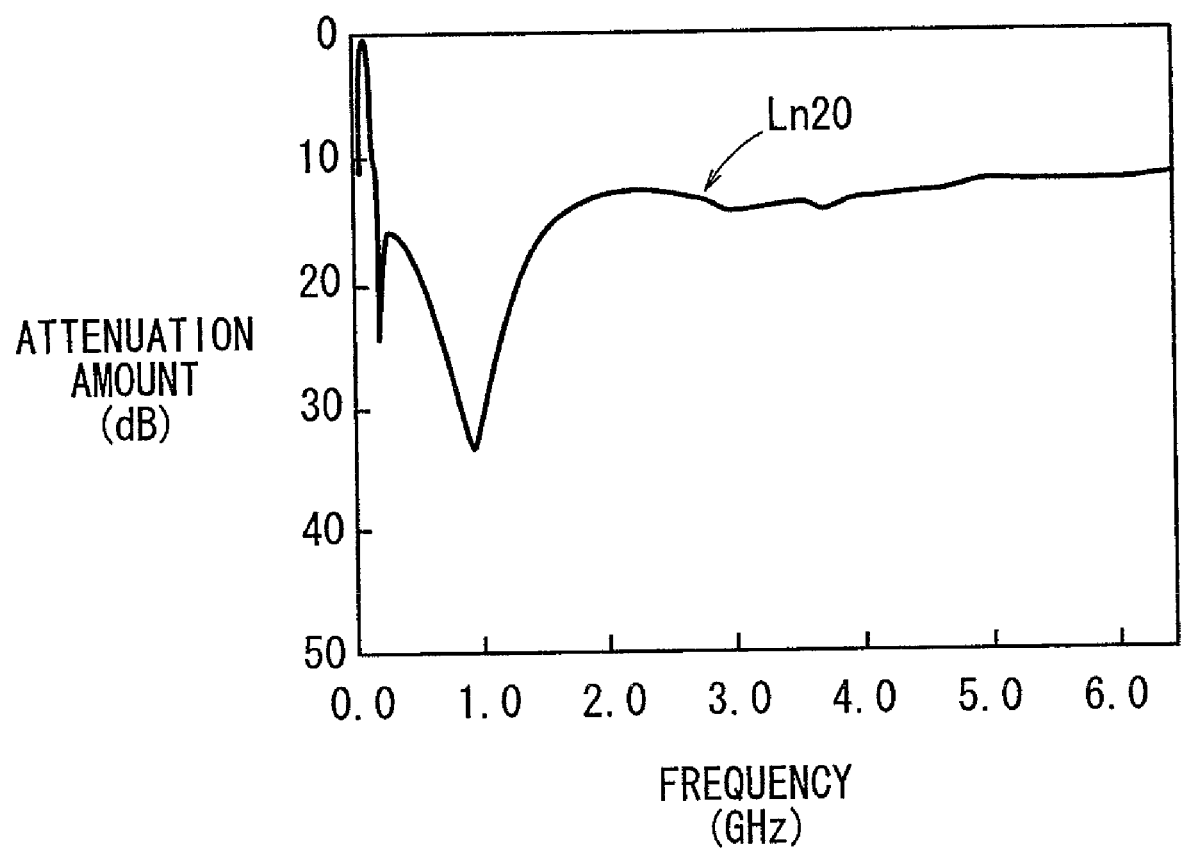
FIG. 18 is a view showing attenuation characteristic (0 to 6 GHz) of the filter concerning the second embodiment.
Figure 19:
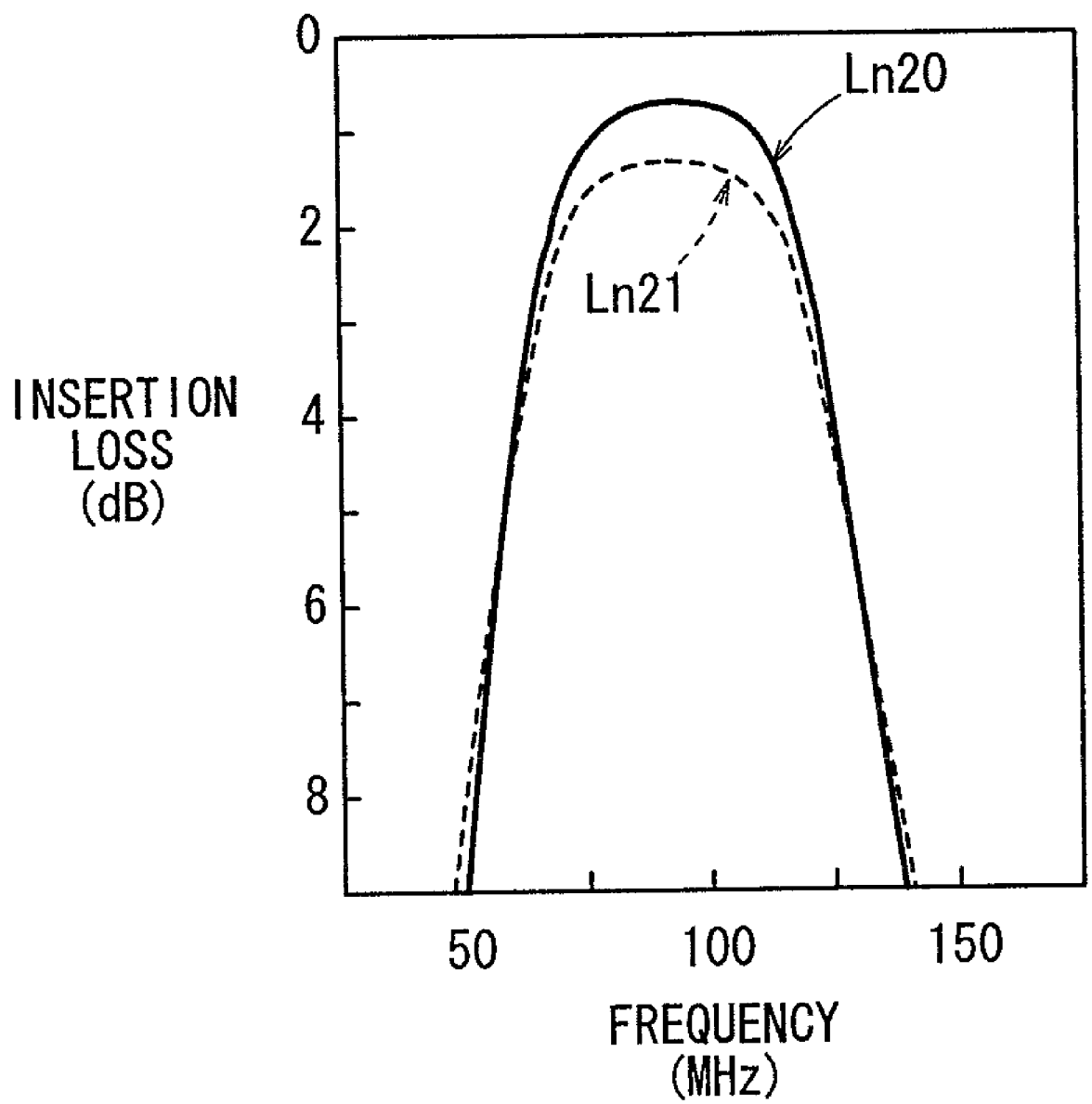
FIG. 19 is a view showing insertion loss characteristic of the filter of the second embodiment and a filter (conventional example) composed of a base member of a dielectric material.

The filter 10B according to the second embodiment constructed with the composition as described above was compared with a filter (conventional example) constructed with a base member of a dielectric material in relation to the characteristics (attenuation characteristic and insertion loss characteristic). Results were obtained as shown in FIGS. 17 to 19. In FIGS. 17 to 19, the solid line Ln20 indicates the characteristics of the filter 10B according to the second embodiment, and the broken line Ln21 indicates the characteristics of the conventional example.

As shown in FIG. 17, in the conventional example, the deterioration (see, for example, rebounds P1, P2) is observed in the attenuation characteristic on the side of the high frequency region (for example, not less than 0.5 GHz). On the contrary, in the case of the filter 10B according to the second embodiment, no deterioration is observed in the attenuation characteristic on the side of the high frequency region. In relation thereto, FIG. 18 shows the measurement result up to 6 GHz. From FIG. 18, no deterioration is observed in the attenuation characteristic on the side of the high frequency region.

As appreciated from FIG. 19 as well, the insertion loss of the filter 10B according to the second embodiment is smaller than that of the conventional example.

As described above, when the filter 10B according to the second embodiment is used, for example, it is possible to carry an FM radio receiver and/or an FM transmitter on a portable device.

It is possible to further improve the characteristics by combining the filter 10A according to the first embodiment and the filter 10B according to the second embodiment.

Next, a filter 10C according to a third embodiment will be explained with reference to FIGS. 20 to 24.

In the filter 10C according to the third embodiment, among the dielectric portion 18, the magnetic portion 20, and the joint portion 22 shown in FIG. 2, the material of the magnetic portion 20 is specified and those of the dielectric portion 18 and the joint portion 22 are the same as or equivalent to that of the filter 10B according to the second embodiment described above.

The magnetic material, which constitutes the magnetic portion 20 of the filter 10C according to the third embodiment, is preferably ferrite containing a main component of a composition in which NiO is 37.4 to 42.2 mol %, ZnO is 0.01 to 3.6 mol %, $Fe_2O_3$ is 46.2 to 48 mol %, $Co_3O_4$ is 0.1 to 0.8 mol %, and CuO is 10 to 14 mol %.

More preferably, the magnetic material is ferrite containing a main component of a composition in which NiO is 37.4 to 42.2 mol %, ZnO is 0.01 to 1.9 mol %, $Fe_2O_3$ is 46.6 to 48 mol %, $Co_3O_4$ is 0.1 to 0.5 mol %, and CuO is 10 to 14 mol %.

The reason thereof will be explained on the basis of results of a fifth experimental example shown in FIGS. 20 to 23.

In the fifth experimental example, the temperature coefficient τμ and the high frequency characteristic (frequency for Q=100) are measured when the base member 16 is manufactured with different amounts of $Co_3O_4$, ZnO, $Fe_2O_3$, and NiO added respectively. In FIGS. 20 to 23, the solid line Ln101 indicates the characteristic of the temperature coefficient, and the broken line Ln102 indicates the high frequency characteristic.

In order that the filter characteristic taking the temperature coefficient into consideration is practical, it is necessary that the temperature coefficient τμ is not more than 1,000 ppm/° C., and the high frequency characteristic (frequency for Q=100) is not less than 100 MHz. The first range T1, which satisfies this condition (Condition 1), is shown in FIGS. 20 to 23. More preferably, the temperature coefficient τμ is not more than 500 ppm/° C., and the high frequency characteristic is not less than 100 MHz. The second range T2, which satisfies this condition (Condition 2), is also shown in FIGS. 20 to 23.

Figure 20:
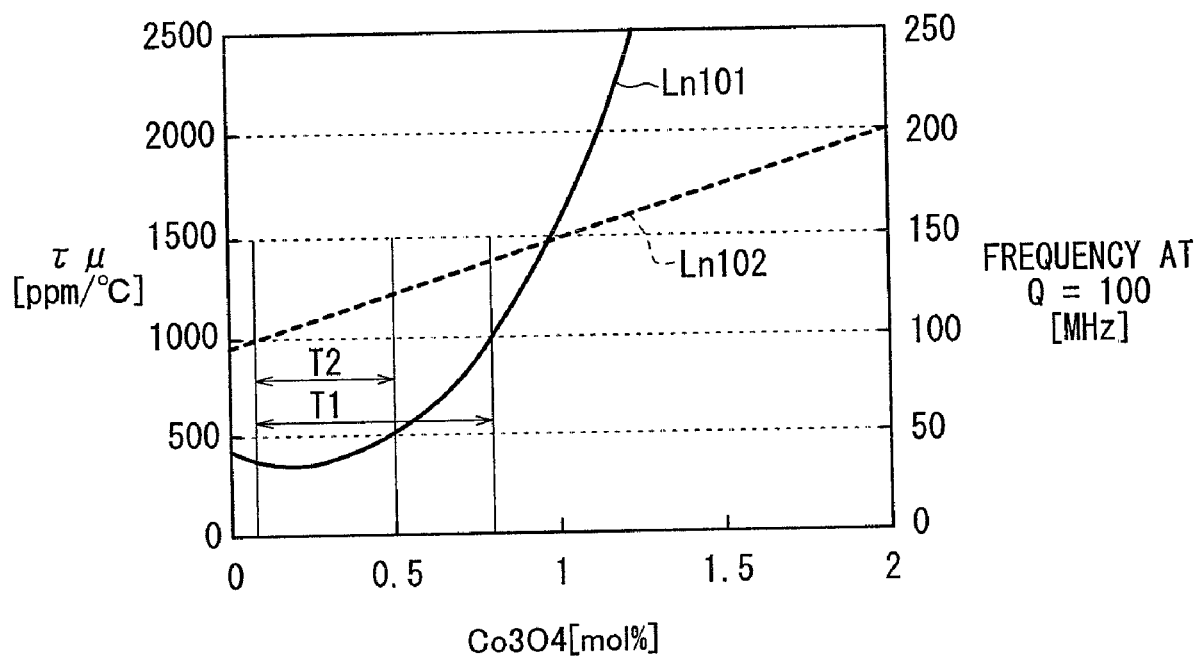
FIG. 20 is a view showing the characteristics illustrating the change of the high frequency characteristic and the temperature coefficient with respect to the amount of $Co_3O_4$ added in a fifth experimental example.

At first, as for $Co_3O_4$, as shown in FIG. 20, the temperature coefficient is increased as the amount of addition is increased. This phenomenon may be caused by the high magnetic anisotropy of Co. Such a tendency is also observed that the high frequency characteristic is also increased as the amount of $Co_3O_4$ added is increased. It is understood that the high frequency characteristic is slightly lower than 100 MHz when the amount of addition is 0 mol %.

Figure 21:
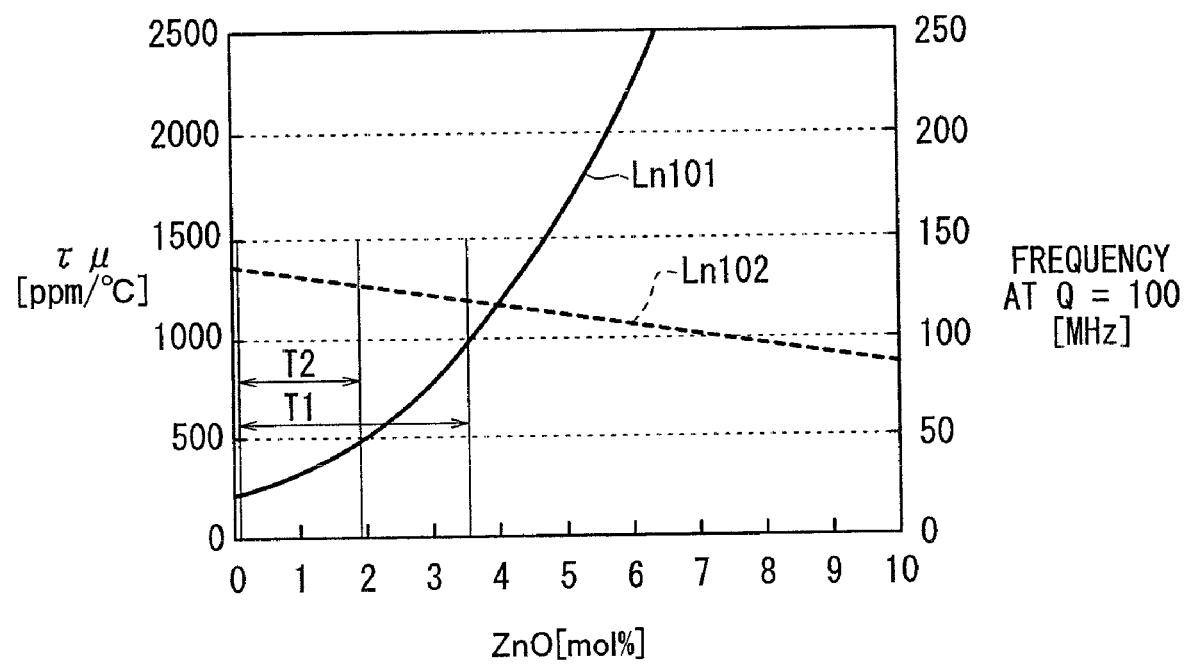
FIG. 21 is a view illustrating the change of the high frequency characteristic and the temperature coefficient with respect to the amount of ZnO added in the fifth experimental example.

Next, as for ZnO, as shown in FIG. 21, the temperature coefficient is increased, and the high frequency characteristic is lowered, as the amount of addition is increased. The temperature coefficient exceeds 1,000 ppm/° C. at the stage at which the amount of addition exceeds 3.6 mol %. The high frequency characteristic is 100 MHz at the stage at which the amount of addition is not less than 6 mol %. Therefore, the first range T1 is determined by the temperature coefficient.

Figure 22:
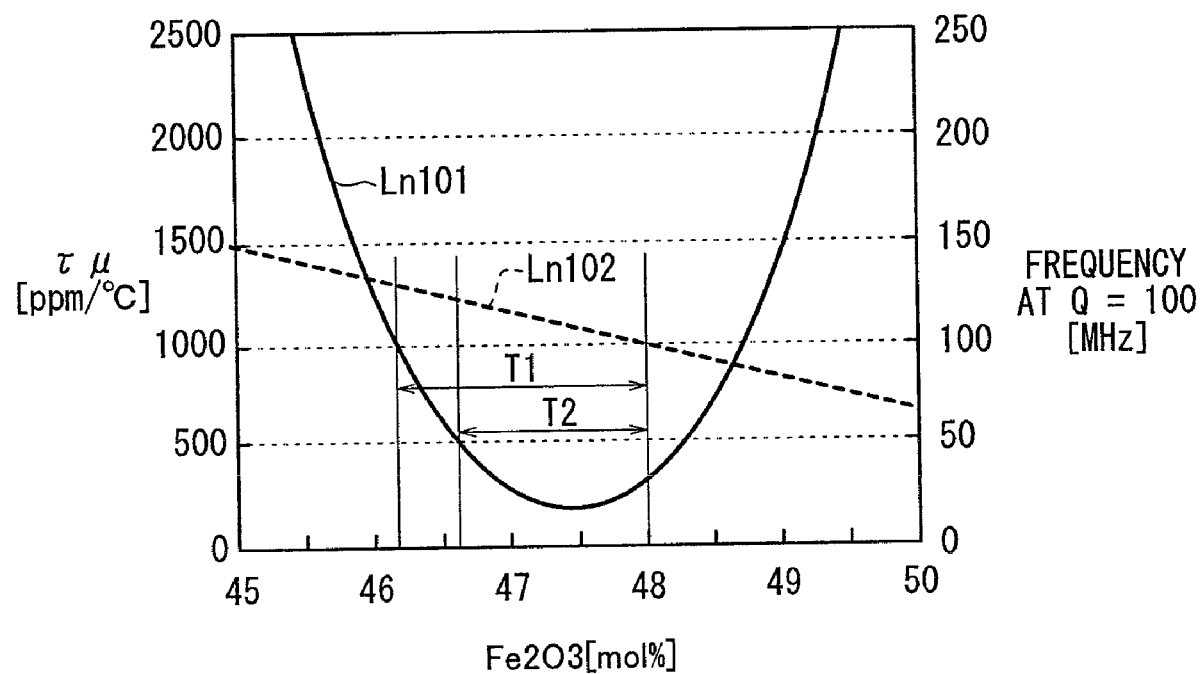
FIG. 22 is a view illustrating the change of the high frequency characteristic and the temperature coefficient with respect to the amount of $Fe_2O_3$ added in the fifth experimental example.

As for $Fe_2O_3$, as shown in FIG. 22, the temperature coefficient is high and the temperature characteristic is deteriorated outside the first range T1. The high frequency characteristic is lowered as the amount of addition is increased. The high frequency characteristic is less than 100 MHz at the stage at which the amount of addition exceeds 48 mol %.

Figure 23:
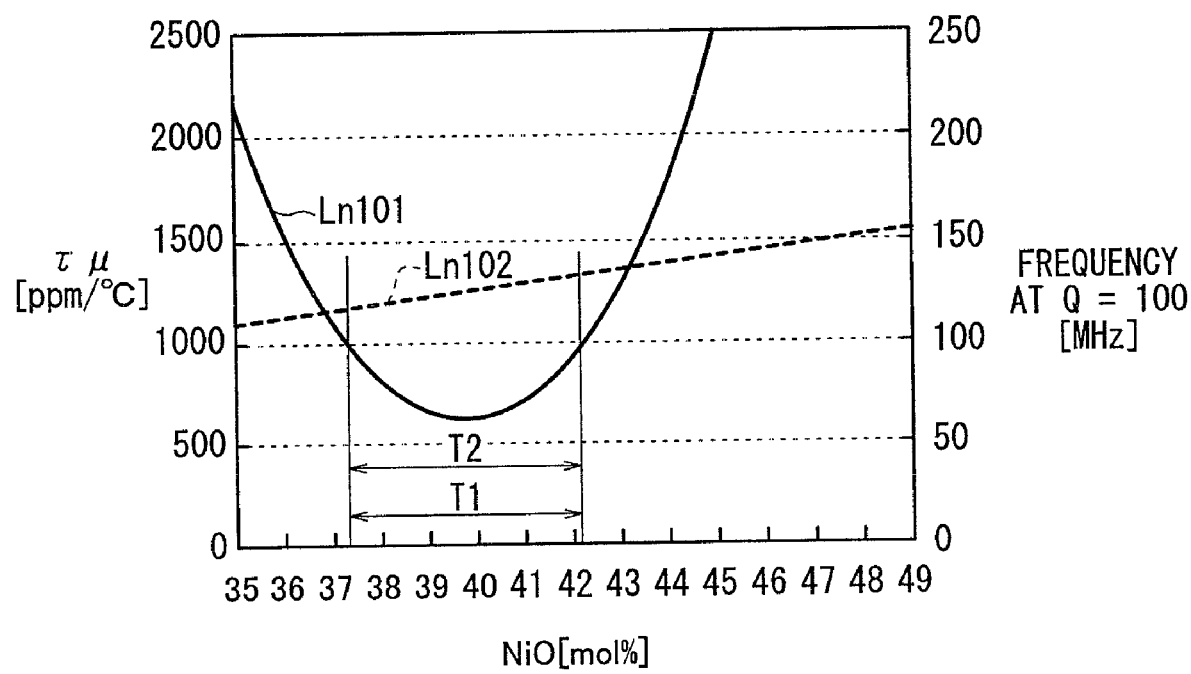
FIG. 23 is a view illustrating the change of the high frequency characteristic and the temperature coefficient with respect to the amount of NiO added in the fifth experimental example.

As for NiO, as shown in FIG. 23, the temperature coefficient is high and the temperature characteristic is deteriorated outside the first range T1. However, the high frequency characteristic of not less than 100 MHz can be realized within the measurement range (35 to 49 mol %).

The composition range of the magnetic material for forming the magnetic portion 20 described above can be determined from the first range T1 and the second range T2 shown in FIGS. 20 to 23.

FIG. 24 shows results of an experimental example (sixth experimental example) in which the initial magnetic permeability (initial magnetic permeability at a frequency of 10 MHz and a temperature of 25° C.), the temperature coefficient (temperature coefficient at a frequency of 10 MHz), and the high frequency characteristic (frequency for Q=100) are measured for Examples 101 to 108 and for Comparative Examples 101 to 107. In Examples 101 to 108, in which the amount of CuO added is constant (12 mol %) and the amounts of addition of NiO, ZnO, $Fe_2O_3$, and $Co_3O_4$ are within the first range T1 or the second range T2 described above. In Comparative Examples 101 to 107, CuO added is constant (12 mol %) and the amounts of addition of NiO, ZnO, $Fe_2O_3$, and $Co_3O_4$ are outside the first range T1 described above.

According to the results shown in FIG. 24, in Comparative Example 101, the temperature coefficient was 860 ppm/° C. which was satisfactory. However, the high frequency characteristic was 70 MHz which was not less than 100 MHz for the practical level. Similarly, also in Comparative Example 106, the temperature coefficient was 360 ppm/° C. which was satisfactory. However, the high frequency characteristic was 65 MHz which was not at the practical level.

In any one of Comparative Examples 102 to 105, the high frequency characteristic was not less than 100 MHz of the practical level. However, the temperature coefficient did not satisfy the practical level of not more than 1,000 ppm/° C.

In Comparative Example 107, the temperature coefficient did not satisfy the practical level of 1,000 ppm/° C. Further, the high frequency characteristic also did not satisfy the practical level of not less than 100 MHz.

On the other hand, in Examples 101, 102, and 104 to 108, the temperature coefficient satisfied the value of not more than 500 ppm/° C., and the high frequency characteristic also satisfied the value of not less than 100 MHz. The satisfactory results were obtained.

In Example 103, the result did not exceed the results of Examples 101, 102, and 104 to 108. However, the temperature coefficient satisfied the value of not more than 1,000 ppm/° C., and the high frequency characteristic also satisfied the value of not less than 100 MHz. The satisfactory results were obtained.

As described above, both of the temperature characteristic and the high frequency characteristic are satisfactory in the filter 10C according to the third embodiment. When the filter 10C is used, it is possible to carry an FM radio receiver and/or an FM transmitter on a portable device for example.

It is possible to further improve the characteristics by combining the filter 10A according to the first embodiment and the filter 10C according to the third embodiment.

It is a matter of course that the electronic part according to the present invention is not limited to the embodiments described above, which may be embodied in other various forms without deviating from the gist or essential characteristics of the present invention.

The invention claimed is:

1. An electronic part having a base member constructed by joining a dielectric portion and a magnetic portion, wherein
 a passband is a band of 76 to 108 MHz or a part thereof, and attenuation from 200 MHz to 6 GHz is not less than 10 dB,
 wherein said base member has a dimension of not more than 2.0 mm×1.25 mm×1 mm, and said electronic part is usable for a portable device, and
 wherein a magnetic material, which forms said magnetic portion, is ferrite containing a main component of a composition in which NiO is 31 to 42 mol %, ZnO is 2 to 10 mol %, $Fe_2O_3$ is 43 to 48 mol %, $Co_3O_4$ is 0.5 to 3 mol %, and CuO is 10 to 14 mol %, said ferrite having an initial magnetic permeability of not less than 10 at a frequency of not more than 150 MHz.

2. The electronic part according to claim 1, wherein said magnetic material, which forms said magnetic portion, is ferrite containing a main component of a composition in which NiO is 37.4 to 42.2 mol %, ZnO is 0.01 to 3.6 mol %, $Fe_2O_3$ is 46.2 to 48 mol %, $Co_3O_4$ is 0.1 to 0.8 mol %, and CuO is 10 to 14 mol %.

3. The electronic part according to claim 1, wherein a dielectric material, which forms said dielectric portion, contains a main component of a composition in $xBaO \cdot y_1Nd_2O_3 \cdot y_2Bi_2O_3 \cdot zTiO_2$, wherein $0.09 \leq x \leq 0.25$ $0.05 \leq y_1 \leq 0.20$ $0 < y_2 \leq 0.10$ $0.60 \leq z \leq 0.75$.

4. The electronic part according to claim 1, wherein:
 said base member has a joint portion disposed between said dielectric portion and said magnetic portion; and
 a material, which forms said joint portion, is a BaO—$TiO_2$—ZnO based dielectric.

* * * * *